(12) United States Patent
Ifuku et al.

(10) Patent No.: US 10,038,394 B2
(45) Date of Patent: Jul. 31, 2018

(54) VIBRATION WAVE DRIVE DEVICE, STATOR FOR A VIBRATION WAVE MOTOR, VIBRATION WAVE MOTOR, DRIVING CONTROL SYSTEM, OPTICAL APPARATUS, AND MANUFACTURING METHOD OF A VIBRATION WAVE DRIVING DEVICE

(71) Applicant: CANON KABUSHIKI KAISHA, Tokyo (JP)

(72) Inventors: Toshihiro Ifuku, Yokohama (JP); Tatsuo Furuta, Machida (JP); Kenichi Takeda, Yokohama (JP); Shinya Koyama, Tokyo (JP); Hidenori Tanaka, Yokohama (JP); Satoshi Fujita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 239 days.

(21) Appl. No.: 14/890,033

(22) PCT Filed: Jun. 23, 2014

(86) PCT No.: PCT/JP2014/067297
§ 371 (c)(1),
(2) Date: Nov. 9, 2015

(87) PCT Pub. No.: WO2014/208765
PCT Pub. Date: Dec. 31, 2014

(65) Prior Publication Data
US 2016/0118914 A1    Apr. 28, 2016

(30) Foreign Application Priority Data
Jun. 28, 2013  (JP) .................................. 2013-135972

(51) Int. Cl.
*H02N 2/16*  (2006.01)
*H01L 41/047*  (2006.01)
(Continued)

(52) U.S. Cl.
CPC ......... *H02N 2/163* (2013.01); *H01L 41/0475* (2013.01); *H01L 41/257* (2013.01);
(Continued)

(58) Field of Classification Search
CPC . H02N 2/163; H02N 2/08; H02N 2/16; H01L 41/0475; H01L 41/257
(Continued)

(56) References Cited

U.S. PATENT DOCUMENTS 5,134,348 A * 7/1992 Izukawa .................. H02N 2/14
310/116
5,471,108 A * 11/1995 Guyomar ............. H02N 2/0085
310/316.02
(Continued)

FOREIGN PATENT DOCUMENTS

JP   63-194580 A   8/1988
JP   03-285575 A   12/1991
(Continued)

OTHER PUBLICATIONS

Office Action dated Apr. 5, 2017, in Chinese Patent Application No. 201480035744.5.
(Continued)

*Primary Examiner* — Bryan Gordon
(74) *Attorney, Agent, or Firm* — Fitzpatrick, Cella, Harper & Scinto

(57) ABSTRACT

A vibration wave drive device includes an annular piezoelectric element including a piezoelectric material and multiple electrodes provided sandwiching the piezoelectric material, the annular piezoelectric element being configured to vibrate by a traveling wave of a wavelength λ; and a power feeding member including at least an electric wire for supplying electric power to the element, the feeding member being provided at a first surface of the element. The element
(Continued)

includes at least two driving regions, and a non-driving region arranged between two of the at least two driving regions and having an average annular length of $n\lambda/4$, n being an odd number. At least one electrode provided on the first surface is arranged across the driving region and the non-driving region, and is electrically connected to the feeding member only in the non-driving region.

11 Claims, 15 Drawing Sheets

(51) Int. Cl.

| | | |
|---|---|---|
| *H01L 41/257* | (2013.01) | |
| *H01L 41/29* | (2013.01) | |
| *H02N 2/14* | (2006.01) | |
| *H02N 2/00* | (2006.01) | |

(52) U.S. Cl.
CPC ........... *H01L 41/29* (2013.01); *H02N 2/0085* (2013.01); *H02N 2/14* (2013.01)

(58) Field of Classification Search
USPC .......................... 310/323.06, 323.03, 323.04
See application file for complete search history.

(56) References Cited

U.S. PATENT DOCUMENTS

| | | | |
|---|---|---|---|
| 5,563,478 A | 10/1996 | Suganuma | |
| 6,211,604 B1 | 4/2001 | Oda et al. | |
| 6,288,475 B1* | 9/2001 | Ito | H02N 2/147 |
| | | | 310/323.01 |
| 6,943,481 B2* | 9/2005 | Okamoto | H02N 2/163 |
| | | | 310/323.03 |
| 9,509,235 B2 | 11/2016 | Furuta et al. | |
| 2001/0022485 A1* | 9/2001 | Oda | H02N 2/163 |
| | | | 310/323.04 |
| 2014/0125199 A1* | 5/2014 | Furuta | C04B 35/4682 |
| | | | 310/323.06 |

FOREIGN PATENT DOCUMENTS

| | | |
|---|---|---|
| JP | 06-319273 A | 11/1994 |
| JP | 2005-210860 A | 8/2005 |
| JP | 2013-034366 A | 2/2013 |

OTHER PUBLICATIONS

International Search Report and Written Opinion in PCT/JP2014/067297, dated Sep. 8, 2014.

International Preliminary Report on Patentability issued in International Patent Application No. PCT/JP2014/067297, dated Jan. 7, 2016.

Office Action dated Feb. 6, 2017, in Korean Patent Application No. 10-2016-7001631.

Office Action dated May 8, 2018, in Japanese Patent Application No. 2014-131558.

* cited by examiner

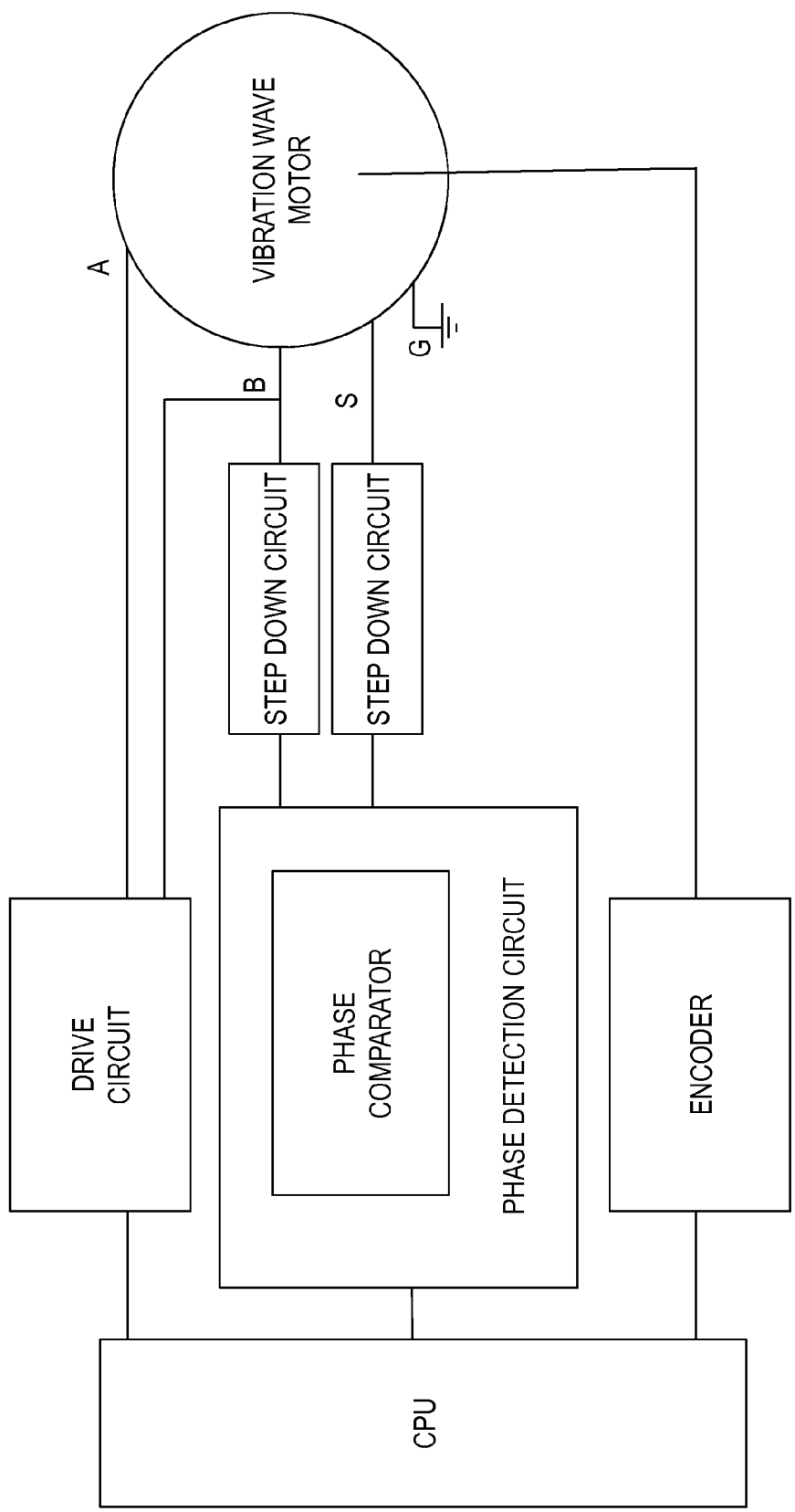

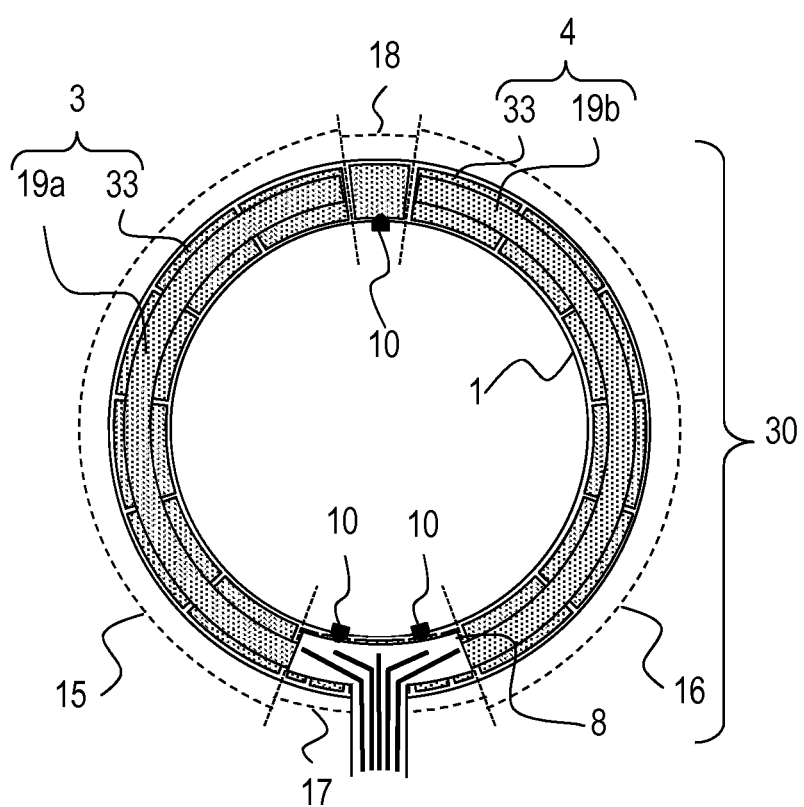

VIBRATION WAVE DRIVE DEVICE, STATOR FOR A VIBRATION WAVE MOTOR, VIBRATION WAVE MOTOR, DRIVING CONTROL SYSTEM, OPTICAL APPARATUS, AND MANUFACTURING METHOD OF A VIBRATION WAVE DRIVING DEVICE

TECHNICAL FIELD

The present invention relates to a vibration wave drive device, a stator for a vibration wave motor, a vibration wave motor, a driving control system, an optical apparatus, and a manufacturing method of a vibration wave driving device. In particular, the present invention relates to a power feeding member for supplying electric power to an electrode of, for example, an annular vibration wave motor in which an electric-mechanical energy converting element is used to excite vibrations in a vibrating member and the resulting vibrational energy is used to generate a drive force.

BACKGROUND ART

A vibration (vibration wave) actuator includes a vibrator that excites drive vibrations to an annular, oblong, or rod-shaped elastic member when an electrical signal, such as an alternating voltage, is applied to an electric-mechanical energy converting element, such as a piezoelectric element. As an example of the vibration actuator, there is proposed a vibration wave motor in which the vibrator is moved relative to an elastic member that is brought into pressure contact with the vibrator.

Now, an annular vibration wave drive device, a stator for a vibration wave motor, a vibration wave motor, and a driving control system are schematically described. The annular vibration wave motor includes an annular piezoelectric element that has an inner diameter and an outer diameter such that the entire circumferential length is equal to an integral multiple of a certain length $\lambda$. The piezoelectric element includes two driving regions (drive phases) each having a circumferential length that is equal to an integral multiple of $\lambda/2$ along the annular direction. The two drive phases are subjected to polarization processing of reversing the polarity alternately at $\lambda/2$ pitches along the annular direction. Therefore, when voltages in the same direction are applied to the drive phases, the piezoelectric element in the drive phases can expand and contract alternately reversely for every $\lambda/2$ pitch along the annular direction due to an inverse piezoelectric effect.

The two drive phases are arranged so as to sandwich a non-driving region therebetween, which has a circumferential length that is equal to an odd multiple of $\lambda/4$ along the annular direction. In the non-driving region, the piezoelectric element is not subjected to polarization, the piezoelectric element is not applied with a voltage, or the piezoelectric element is subjected to processing that prevents a voltage from being effectively applied thereto. Therefore, the piezoelectric element in the non-driving region cannot actively expand or contract.

The non-driving region may include a detection phase (detection region) for detecting the vibration state of the piezoelectric material. In the detection phase, the piezoelectric element is subjected to polarization processing. Therefore, when a strain is generated in the piezoelectric element in the detection phase by an external force, the piezoelectric element in the detection phase outputs a voltage in accordance with the amount of the strain due to a direct piezoelectric effect.

The vibration wave drive device is obtained by providing electric wire for electric power supply to the drive phase of the piezoelectric element and providing electric wire for voltage detection to the detection phase of the piezoelectric element. A diaphragm formed of an elastic member is bonded to the vibration wave drive device to obtain the stator for a vibration wave motor. As the electric wire, a flexible printed board that is an integrated power feeding member is generally used.

In the stator for a vibration wave motor, when an alternating voltage having a frequency that is the natural frequency of the stator for a vibration wave motor is applied to only one drive phase of the annular piezoelectric element, a standing wave having a wavelength $\lambda$ is generated in the diaphragm across the entire circumference of the diaphragm along the annular direction. Further, when a similar alternating voltage is applied to only the other drive phase, a standing wave having a wavelength $\lambda$ is similarly generated in the diaphragm across the entire circumference of the diaphragm along the annular direction. Further, the positions of nodes of the standing waves generated by the two drive phases are shifted from each other by $\lambda/4$ along the annular direction of the diaphragm.

Alternating voltages each having a frequency that is the natural frequency of the stator for a vibration wave motor are applied to the two drive phases of the stator for a vibration wave motor in such a manner that the frequencies are the same and the temporal phase difference is $\pi/2$. Then, due to synthesis of the standing waves of the two drive phases, a traveling wave having a wavelength $\lambda$, which travels in the annular direction, is generated in the diaphragm.

At this time, when focusing on one certain point of the surface of the diaphragm (surface on which the vibration wave drive device is not bonded), a kind of elliptic motion occurs on the surface of the diaphragm. This elliptic motion occurs at all positions of the diaphragm along the annular direction, and hence an object that is held in contact with the diaphragm surface can move along the annular direction of the diaphragm. Further, when the temporal phase difference of the alternating voltages to be applied to the two drive phases is switched to $-\pi/2$, the object moving direction is reversed.

By bringing an annular elastic member called a rotor into pressure contact with the surface of the diaphragm of the stator for a vibration wave motor, the vibration wave motor is obtained. The positive or negative sign of the temporal phase difference of the alternating voltages to be applied to the two drive phases of the annular piezoelectric element is switched, and the magnitude of the alternating voltages and the frequency of the alternating voltages are finely adjusted. In this manner, a desired traveling wave can be generated in the stator for a vibration wave motor so as to change the rotational direction, torque, and rotational speed of the rotor.

By connecting a drive circuit to the vibration wave motor, the driving control system is obtained. The drive circuit includes a phase comparator for comparing the phases of the two alternating voltages to output, as a voltage value, phase information based on the result. For example, when the vibration wave motor is driven, the alternating voltage output from the detection phase and the alternating voltage applied to the drive phase are input to the phase comparator. Then, based on the phase difference information output from the phase comparator, a deviation from the resonant state can be known. The electrical signal to be applied to the drive phase is determined based on this information to generate a desired traveling wave. In this manner, the rotational speed of an ultrasonic motor is controlled.

Further, as such an annular vibration actuator, there is known a vibration actuator disclosed in PTL 1.

The ultrasonic motor disclosed in PTL 1 is an annular vibration wave motor including a vibrator that is the stator for a vibration wave motor, which is obtained by bonding an elastic member that is the diaphragm to the vibration wave drive device in which a flexible printed board that is the power feeding member is provided to a piezoelectric body that is the piezoelectric element, and a moving element that is the annular elastic member called the rotor.

The piezoelectric body includes an A-phase electrode that is an A-phase common electrode, a B-phase electrode that is a B-phase common electrode, and an electrode for ground. The flexible printed board includes an A-phase signal line and a B-phase signal line, which are electric wires for supplying electric power to the drive phases, and a ground signal line. Each of the signal lines includes a land portion (exposed portion). The A-phase signal line, the B-phase signal line, and the ground signal line of the flexible printed board are connected to the A-phase electrode, the B-phase electrode, and the electrode for ground of the piezoelectric body, respectively, at the respective land portions.

Further, on a surface of the piezoelectric body on which the A-phase electrode, the B-phase electrode, and the electrode for ground are formed and on a surface thereof on the opposite side across the piezoelectric material, a ground electrode (not shown) is formed. The ground electrode is a common electrode that is electrically connected to the elastic member so as to maintain the surface of the ground electrode of the piezoelectric body to a ground potential through intermediation of the elastic member. The ground electrode is electrically connected to the electrode for ground through intermediation of the elastic member.

The electrode for ground is provided between the A-phase electrode and the B-phase electrode of the piezoelectric body. As disclosed in PTL 1, an interval corresponding to a $\lambda/4$ wavelength is provided between an A phase and a B phase that are the drive phases. That is, a region of the piezoelectric body that includes the electrode for ground is the non-driving region that has a $\lambda/4$ circumferential length along the annular direction. The electrode for ground and the ground electrode are electrically connected to each other through intermediation of the elastic member, and hence the piezoelectric body between the electrode for ground and the ground electrode is not effectively applied with a voltage.

Further, as such an annular vibration actuator, there is known a vibration actuator disclosed in PTL 2.

The ultrasonic motor disclosed in PTL 2 is an annular vibration wave motor including a rotor and a stator for a vibration wave motor, which is obtained by bonding a metal elastic member 2 that is the diaphragm to the vibration wave drive device in which lead lines and trimming resistors that are the power feeding members are provided to the piezoelectric element having polarized parts (piezoelectric elements 15, 16, and 17 of PTL 2) and an unpolarized part (piezoelectric element 14 of PTL 2).

The drive phase electrodes of the piezoelectric element (piezoelectric elements 15 and 16 of PTL 2) are respectively connected to the trimming resistors that are the power feeding members, and the trimming resistors are respectively connected to the lead lines.

In this case, the trimming resistors are represented by Ra and Rb in the equivalent circuit of FIG. 2 in PTL 2. The trimming resistors are each a thin-film resistor obtained by mixing ceramics with metal, and are each a variable resistor that can be cut by a laser beam. Further, as illustrated in FIG. 3 of PTL 2, the resistance value changes depending on temperature, and is larger than 100Ω.

On a surface of the piezoelectric element (piezoelectric elements 15 and 16 of PTL 2) on which the drive phase electrodes are formed and on a surface thereof on the opposite side across the piezoelectric body, a full-surface electrode (not shown) is formed. The full-surface electrode is a common electrode that is electrically connected to the metal elastic member so as to maintain the metal elastic member to a ground potential through a center portion thereof. Further, the piezoelectric element (piezoelectric element 17 of PTL 2) includes a monitor electrode, and the vibration state of the piezoelectric element (piezoelectric element 17 of PTL 2) can be detected by sandwiching the piezoelectric body with the common electrode.

That is, in the ultrasonic motor disclosed in PTL 2, the piezoelectric elements (piezoelectric elements 15 and 16 of PTL 2) become the drive phases, and another piezoelectric element (piezoelectric element 17 of PTL 2) becomes the detection phase provided in the non-driving region. Further, the unpolarized piezoelectric element (piezoelectric element 14 of PTL 2) also becomes the non-driving region. In view of the drive principle of the annular vibration wave motor and FIG. 1 of PTL 2, the non-driving region of the piezoelectric element (region in which the piezoelectric element 14 is arranged in PTL 2) has a $3\lambda/4$ circumferential length along the annular direction. Further, the non-driving region of the piezoelectric element (region in which the piezoelectric element 17 is arranged in PTL 2) has a $\lambda/4$ circumferential length along the annular direction.

CITATION LIST

Patent Literature

PTL 1: Japanese Patent Application Laid-Open No. 2005-210860

PTL 2: Japanese Patent Application Laid-Open No. H03-285575

SUMMARY OF INVENTION

Technical Problem

Meanwhile, in recent years, higher performance, higher quality, and lower cost are required in the vibration actuator. The power feeding member is one factor that suppresses the vibration of the vibration actuator. In a related-art vibration actuator such as an annular vibration wave motor, the electric wire for supplying electric power to the drive phase is directly connected to the drive phase electrode through intermediation of the power feeding member. Therefore, the piezoelectric element is inhibited from spontaneously expanding and contacting, and thus the vibration of the vibration actuator is suppressed. Particularly in recent years, in order to reduce the cost and improve the quality, the flexible printed board is used as the power feeding member of the vibration actuator. However, in the related-art vibration actuator such as the annular vibration wave motor, the power feeding members are bonded across a wide region including not only the non-driving region but also parts of the two drive phases. Therefore, not only the reduction in performance of the vibration actuator but also the reduction in quality due to the performance fluctuation and the increase in cost of the power feeding member have been a problem.

The present invention has been accomplished in view of the above-mentioned problems, and is directed to proving a vibration wave drive device, a stator for a vibration wave motor, a vibration wave motor, a driving control system, an optical apparatus, and a manufacturing method of a vibration wave driving device, which are capable of achieving higher performance, higher quality, and lower cost of an annular vibration actuator without inhibiting active expansion and contraction of a piezoelectric element unlike the related art.

Solution to Problem

In order to solve the above-mentioned problems, according to an aspect of the present invention, there is provided a vibration wave drive device, including: an annular piezoelectric element including a one-piece piezoelectric material and multiple electrodes provided so as to sandwich the one-piece piezoelectric material, the annular piezoelectric element being configured to vibrate by a traveling wave of a wavelength λ; and a power feeding member including at least electric wire for supplying electric power to the annular piezoelectric element, the power feeding member being provided on a first surface of the annular piezoelectric element, in which the annular piezoelectric element includes at least two driving regions, and a non-driving region that is arranged between two of the at least two driving regions and has an average annular length of nλ/4, where n is an odd number, and in which at least one electrode provided on the first surface is arranged across the non-driving region and corresponding one of the at least two driving regions, and is electrically connected to the power feeding member only in the non-driving region.

In order to solve the above-mentioned problems, according to another aspect of the present invention, there is provided a stator for a vibration wave motor, including at least: the above-mentioned vibration wave drive device; and a diaphragm provided on at least one electrode surface of the annular piezoelectric element.

In order to solve the above-mentioned problems, according to still another aspect of the present invention, there is provided a vibration wave motor, including at least: the above-mentioned stator for a vibration wave motor; and a rotor provided in contact with a vibrating surface of the diaphragm.

In order to solve the above-mentioned problems, according to yet another aspect of the present invention, there is provided a driving control system, including at least a drive circuit that is electrically connected to the above-mentioned vibration wave motor through intermediation of the power feeding member.

In order to solve the above-mentioned problems, according to still a further aspect of the present invention, there is provided an optical apparatus, including the above-mentioned driving control system.

In order to solve the above-mentioned problems, according to yet another aspect of the present invention, there is provided a method of manufacturing the above-mentioned vibration wave drive device, the method including: providing a polarizing electrode on the first surface in each of the at least two driving regions, providing a driving phase power supply electrode on the first surface in the non-driving region, and providing a common electrode on the second surface; applying a voltage to the polarizing electrode to subject the one-piece piezoelectric material to polarization processing; providing a connection electrode across the polarizing electrode and the driving phase power supply electrode; and electrically connecting the driving phase power supply electrode and the power feeding member to each other only in the non-driving region.

Further features of the present invention will become apparent from the following description of exemplary embodiments with reference to the attached drawings.

BRIEF DESCRIPTION OF DRAWINGS

FIG. 7 is a schematic diagram illustrating a circuit of a driving control system according to one embodiment of the present invention.

FIGS. 10A, 10B, 10C, 10D, and 10E are schematic process views illustrating an example of a method of manufacturing a stator for a vibration wave motor of the present invention.

DESCRIPTION OF EMBODIMENTS

Now, exemplary embodiments of the present invention are described.

A vibration wave drive device of the present invention has a feature of including: an annular piezoelectric element including a one-piece piezoelectric material and multiple electrodes provided so as to sandwich the one-piece piezoelectric material, the annular piezoelectric element being configured to vibrate by a traveling wave of a wavelength λ; and a power feeding member including at least electric wire for supplying electric power to the annular piezoelectric element, the power feeding member being provided on a first surface of the annular piezoelectric element, in which the annular piezoelectric element includes at least two driving regions, and a non-driving region that is arranged between two of the at least two driving regions and has an average annular length of nλ/4, where n is an odd number, and in which at least one electrode provided on the first surface is arranged across the non-driving region and corresponding one of the at least two driving regions, and is electrically connected to the power feeding member only in the non-driving region.

Figure 1A:
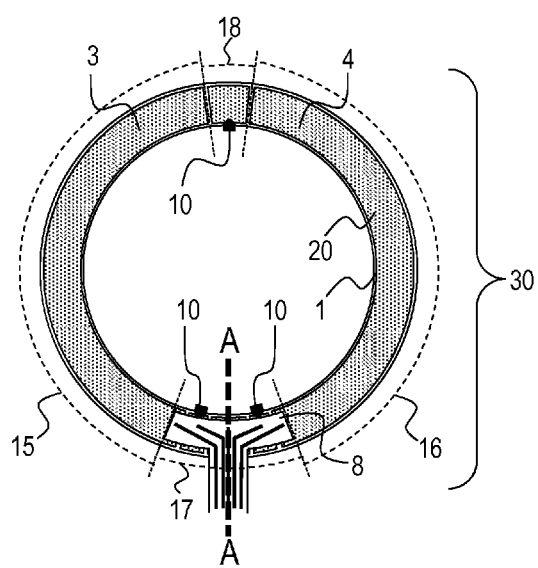
FIGS. 1A, 1B, and 1C are schematic views illustrating a stator for a vibration wave motor according to one embodiment of the present invention.
Figure 1B:
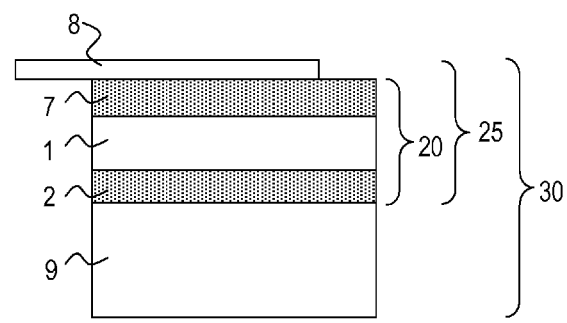
Figure 1C:
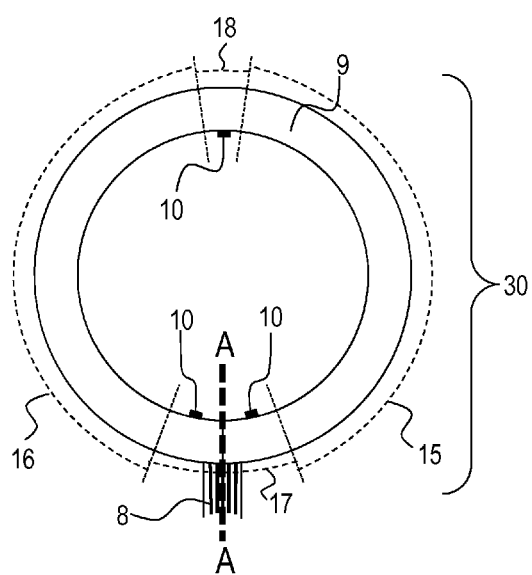

FIGS. 1A, 1B, and 1C are schematic views illustrating a stator 30 for a vibration wave motor according to one embodiment of the present invention. FIG. 1A is a schematic plan view of one surface of the stator 30 for a vibration wave motor of the present invention, FIG. 1B is a sectional view of the stator 30 for a vibration wave motor taken along the line A-A of FIG. 1A, and FIG. 1C is a schematic plan view of a surface on the opposite side to the surface illustrated in FIG. 1A across a piezoelectric element 20 of the stator 30 for a vibration wave motor of the present invention.

Figure 2A:
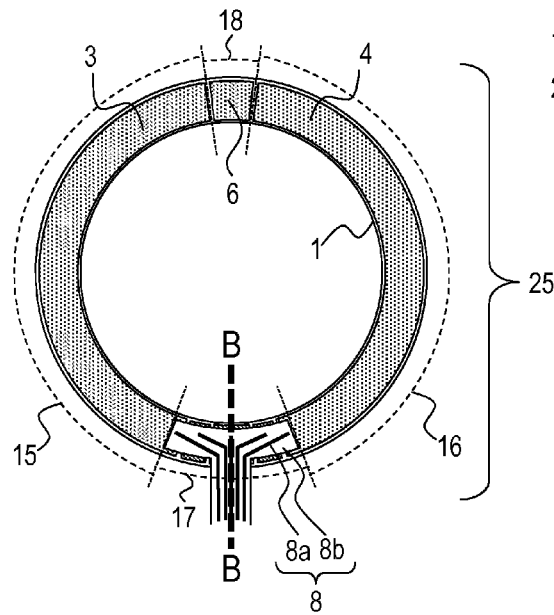
FIGS. 2A, 2B, and 2C are schematic views illustrating a vibration wave drive device according to one embodiment of the present invention.
Figure 2B:
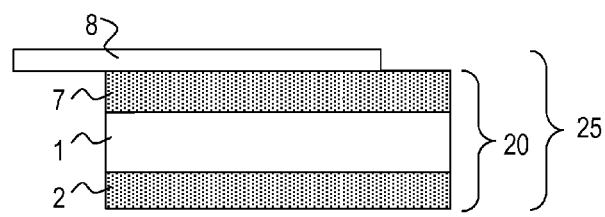
Figure 2C:
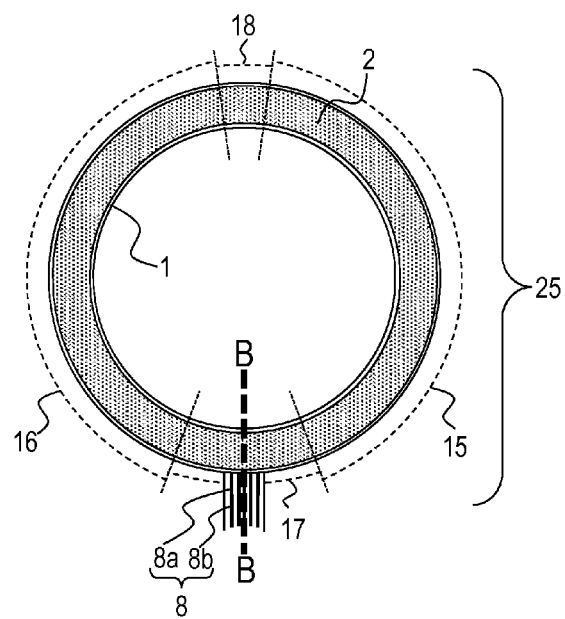

FIGS. 2A, 2B, and 2C are schematic views illustrating a vibration wave drive device 25 according to one embodiment of the present invention. FIG. 2A is a schematic plan view of one surface of the vibration wave drive device 25 of the present invention, FIG. 2B is a sectional view of the vibration wave drive device 25 taken along the line B-B of FIG. 2A, and FIG. 2C is a schematic plan view of a surface on the opposite side to the surface illustrated in FIG. 2A across the piezoelectric element 20 of the vibration wave drive device 25 of the present invention.

Figure 3A:
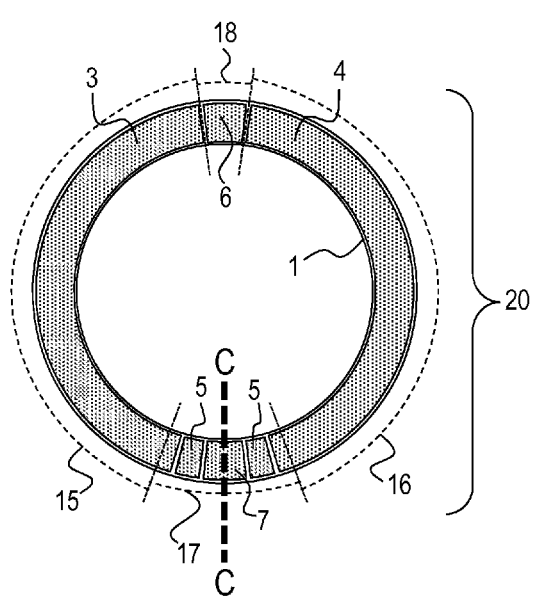
FIGS. 3A, 3B, and 3C are schematic views illustrating a piezoelectric element of the vibration wave drive device according to one embodiment of the present invention.
Figure 3B:
Figure 3C:
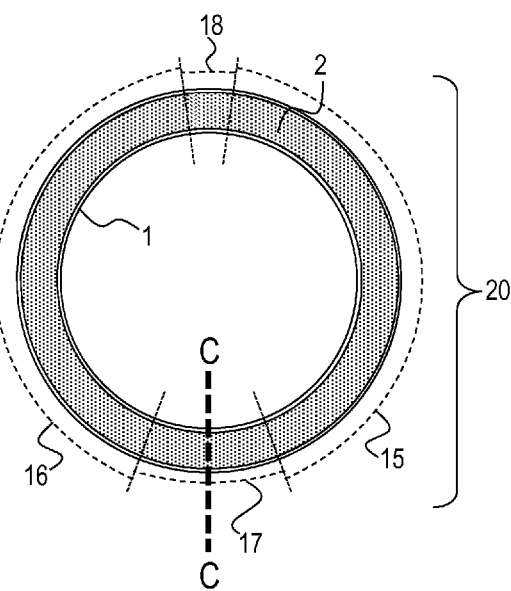

FIGS. 3A, 3B, and 3C are schematic views illustrating the piezoelectric element 20 of the vibration wave drive device 25 according to one embodiment of the present invention. FIG. 3A is a schematic plan view of a first surface of the piezoelectric element 20, FIG. 3B is a sectional view of the piezoelectric element 20 taken along the line C-C of FIG. 3A, and FIG. 3C is a schematic plan view of a surface on the opposite side to the surface illustrated in FIG. 3A across a piezoelectric material 1, that is, a second surface of the piezoelectric element 20.

As illustrated in FIGS. 1A to 1C, the stator 30 for a vibration wave motor of the present invention includes the vibration wave drive device 25, a diaphragm 9, and short-circuiting wire 10. The diaphragm 9 is formed of an elastic member, and is preferred, but not limited, to be a conductor. The diaphragm has a vibrating surface on an opposite side to a surface that is held in contact with the piezoelectric element. Further, as illustrated in FIGS. 2A to 2C, the vibration wave drive device 25 of the present invention includes the piezoelectric element 20 and a power feeding member 8 including at least electric wire 8a for supplying electric power to the piezoelectric element 20 and an insulator 8b, the power feeding member 8 being provided on the first surface of the piezoelectric element 20. It is to be noted that, as illustrated in FIG. 1B, the diaphragm 9 is provided on a surface of the piezoelectric element 20 that is opposed to the first surface, that is, the second surface of the piezoelectric element 20. Further, as illustrated in FIGS. 3A and 3C, the piezoelectric element 20 used in the present invention includes two driving regions 15 and 16 and two non-driving regions 17 and 18 in the annular circumferential direction.

Further, the piezoelectric element 20 used in the present invention includes, for example, a substantially uniform annular one-piece piezoelectric material 1 having a thickness of 0.1 mm to 2.0 mm, and multiple electrodes provided so as to sandwich the piezoelectric material 1. Among the multiple electrodes, a drive phase electrode 3 is provided on the first surface of the piezoelectric element 20, and is arranged across the driving region 15 and the non-driving region 17. Similarly, a drive phase electrode 4 is provided on the first surface of the piezoelectric element 20, and is arranged across the driving region 16 and the non-driving region 17. Two ground electrodes 5 are arranged in the non-driving region 17 so as to be adjacent to the drive phase electrode 3 and the drive phase electrode 4 in the annular direction.

A ground electrode 6 is arranged in the non-driving region 18 so as to be sandwiched between the drive phase electrodes 3 and 4. A detection phase electrode 7 is arranged in the non-driving region 17 so as to be sandwiched between the two ground electrodes 5. Further, as illustrated in FIG. 3C, among the multiple electrodes of the present invention, a common electrode 2 is provided on the second surface of the piezoelectric element 20, and is arranged in an annular shape across the driving regions 15 and 16 and the non-driving regions 17 and 18.

Further, as illustrated in FIG. 2A, the drive phase electrodes 3 and 4 are electrically connected to the electric wire 8a of the power feeding member 8 only in the non-driving region 17, and are not electrically connected to the electric wire 8a in the driving regions 15 and 16. Further, the drive phase electrodes 3 and 4 are physically bonded to the insulator 8b of the power feeding member 8 only in the non-driving region 17, and are not physically bonded to the insulator 8b in the driving regions 15 and 16.

In the vibration wave drive device 25 of the present invention, for example, the common electrode 2 is maintained at a ground potential, and electric power is supplied to the drive phase electrodes 3 and 4 via the electric wire 8a of the power feeding member 8, to thereby apply voltages to the driving regions 15 and 16 of the piezoelectric element 20.

In the stator 30 for a vibration wave motor of the present invention illustrated in FIGS. 1A to 1C, when an alternating voltage having a frequency that is, for example, a seventh-order natural frequency of the stator 30 for a vibration wave motor is applied to the driving region 15, a standing wave having a wavelength $\lambda$ is generated in the diaphragm 9 across the entire circumference of the diaphragm 9 along the annular direction. The same holds true for the other driving region 16. In this case, the positions of the nodes of the standing waves generated by the driving regions 15 and 16 are shifted by $\lambda/4$ along the annular direction of the diaphragm 9 because the non-driving region 18 is provided.

In the stator 30 for a vibration wave motor of the present invention as illustrated in FIGS. 1A to 1C, alternating voltages each having a frequency that is a seventh-order natural frequency of the stator 30 for a vibration wave motor are applied to the driving regions 15 and 16 so that the temporal phase difference thereof is $\pi/2$. In this case, due to the synthesis of the standing waves generated by the two drive phases, a traveling wave having a wavelength $\lambda$, which travels in the annular direction, is generated in the diaphragm 9. The wavelength $\lambda$ of the standing wave can be evaluated by, for example, measuring a displacement amount of the stator 30 for a vibration wave motor by a laser Doppler vibrometer from a side of the surface of FIG. 1A. The wavelength $\lambda$ of the standing wave is equal to two times the average annular length between two close points at which the displacement amount measured by the laser Doppler vibrometer is the maximum. When the wavelength $\lambda$ is determined, it is preferred to measure the displacement amount for 10 times or more by the laser Doppler vibrometer and use the average thereof. At this time, when focusing on one point on the surface of the diaphragm 9 (surface illustrated in FIG. 1C), a kind of elliptic motion occurs on the surface of the diaphragm 9. This elliptic motion occurs at all positions of the diaphragm 9 along the annular direction, and hence an object that is held in contact with the surface of the diaphragm 9 can move along the annular direction of the diaphragm 9. Further, when the temporal phase difference of the alternating voltages to be applied to the two drive phases is set to $-\pi/2$, the object moving direction is reversed. That is, the stator 30 for a vibration wave motor of the present invention illustrated in FIGS. 1A to 1C can be driven in a vibration mode with a seventh-order natural frequency.

In the vibration wave drive device 25 of the present invention, the drive phase electrodes 3 and 4 are arranged across not only the driving regions 15 and 16 but also the non-driving region 17. Therefore, it is unnecessary to electrically connect or physically bond the power feeding member 8 to the driving regions 15 and 16. That is, in the driving regions 15 and 16, the active expansion and contraction of the piezoelectric element 20 are not inhibited by the power feeding member 8. Therefore, reduction in vibration performance of the stator 30 for a vibration wave motor due to the power feeding member 8 is prevented. Further, reduction in quality due to the fluctuation in vibration performance of the stator 30 for a vibration wave motor, which is caused by the positional fluctuation when the power feeding member 8 is connected to the piezoelectric element 20 or the like, is also prevented. Further, the power feeding member 8 is reduced in size as compared to that in the related-art vibration wave drive device, and the cost of the power feeding member 8 can be reduced.

The one-piece piezoelectric material of the present invention means a seamless ceramic piezoelectric material having a homogeneous composition, which is formed by simultaneously firing raw materials having the same composition. Ceramics are generally an aggregation of fine crystals, and each crystal includes an atom with a positive charge and an atom with a negative charge. In most of the ceramics, the positive charge and the negative charge are in a balanced state. However, there is a kind of dielectric ceramics called ferroelectric ceramics in which, even in a natural state, the balance of the positive and negative charges in the crystal is lost to cause a deviation of charges (spontaneous polarization).

After ferroelectric ceramics are fired, the direction of the spontaneous polarization thereof is discrete, and the whole ceramics appear to have no deviation of charges. However, when a high voltage is applied thereto, the direction of the spontaneous polarization is uniformly aligned, which cannot be restored even when the voltage is cancelled. Such aligning of the direction of the spontaneous polarization is generally called polarization processing. Further, when a voltage is applied from outside to ferroelectric ceramics subjected to polarization processing, the center of each of the positive and negative charges inside ceramics is attracted or repelled with respect to an external charge, which causes the ceramic main body to expand and contact (inverse piezoelectric effect). The one-piece piezoelectric material of the present invention refers to a ceramic material that is subjected to polarization processing as described above to cause the inverse piezoelectric effect, and refers to a ceramic material in which at least a part of the one-piece piezoelectric material is subjected to polarization processing.

The driving region of the present invention refers to a region in which, when a voltage is applied to the piezoelectric element, the piezoelectric element can actively expand and contract. There are at least two driving regions, and the average annular length is equal to a multiple of $\lambda/2$. On the other hand, the non-driving region of the present invention refers to a region in which the piezoelectric element cannot actively expand or contract. There are at least two non-driving regions between the two driving regions, and the average annular length is equal to an odd multiple of $\lambda/4$. In an example of the piezoelectric element 20 used in the present invention illustrated in FIGS. 3A to 3C, the average annular length of each of the driving regions 15 and 16 is $3\lambda$. Further, the average annular length of the non-driving region 17 is $3\lambda/4$, and the average annular length of the non-driving region 18 is $\lambda/4$. It is to be noted that, the wavelength $\lambda$ is a design value determined based on the performance required for an actuator such as a vibration wave motor. When the non-driving region whose average annular length is equal to an odd multiple of $\lambda/4$ is formed, even if a deviation of ±20% or less with respect to the wavelength $\lambda$ occurs, the deviation may be allowed as long as the vibration wave can be appropriately propagated. The deviation is preferred to be ±10% or less, and more preferred to be ±5% or less with respect to the wavelength $\lambda$. In addition, a correspondence relationship is desired to be present between the wavelength $\lambda$ and the average annular length of the non-driving region.

As illustrated in FIGS. 3A to 3C, the piezoelectric element 20 used in the present invention includes two driving regions and two non-driving regions, but the piezoelectric element used in the present invention is not limited thereto. As long as the traveling wave that travels in the annular direction is generated in principle in the diaphragm, three or more driving regions and three or more non-driving regions may be provided.

Figure 4A:
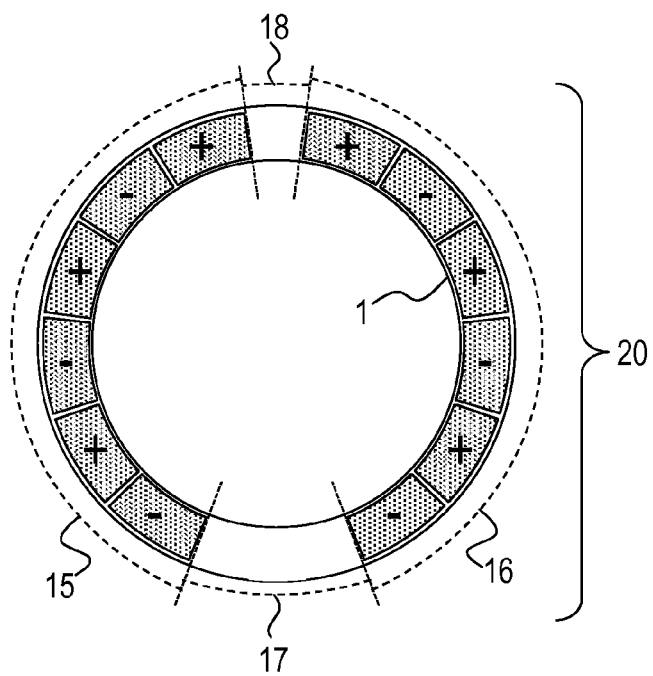
FIGS. 4A and 4B are schematic views illustrating a polarity of expansion and contraction in driving regions of the piezoelectric element used in the present invention.
Figure 4B:
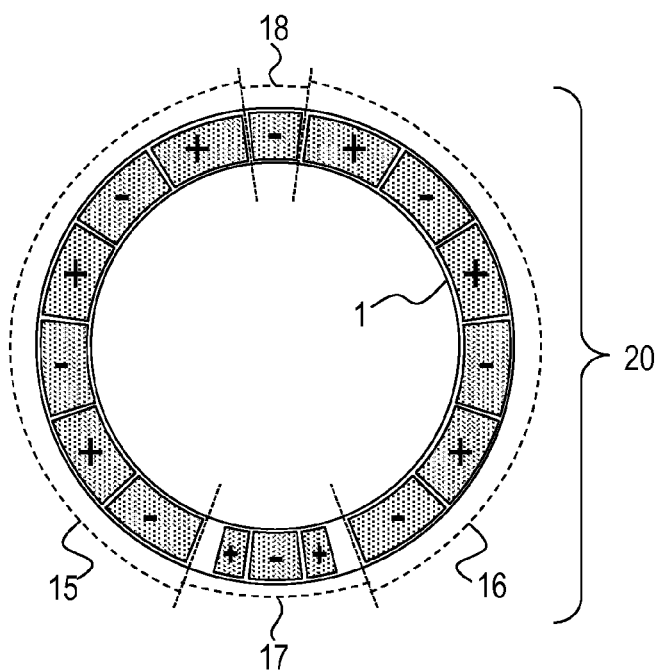

FIGS. 4A and 4B are schematic views illustrating an expansion and contraction polarity in the driving regions 15 and 16 of the piezoelectric element 20 used in the present invention. The polarity of expansion and contraction of the present invention is used so as to distinguish expansion or contraction of the piezoelectric element 20 in the annular direction when a positive voltage is applied to the electrode on the surface of the piezoelectric element 20 illustrated in FIG. 3A (first surface of the piezoelectric element 20). In FIGS. 4A and 4B, a case where the piezoelectric element 20 expands in the annular direction is represented by "+", and a case where the piezoelectric element 20 contracts in the annular direction is represented by "−". The driving regions 15 and 16 of the piezoelectric element 20 used in the present invention illustrated in FIGS. 3A to 3C are subjected to polarization processing of reversing the polarity alternately at $\lambda/2$ pitches along the annular direction in advance. Therefore, when voltages in the same direction are applied to the driving regions 15 and 16, the driving regions 15 and 16 can expand and contract alternately reversely for every $\lambda/2$ pitch along the annular direction due to the inverse piezoelectric effect. That is, as illustrated in FIGS. 4A and 4B, each of the driving regions 15 and 16 has the polarity of expansion and contraction in which the polarity is reversed alternately for every $\lambda/2$ pitch.

Meanwhile, in FIG. 4A, the polarity of expansion and contraction is not illustrated for the non-driving regions 17 and 18. However, this does not mean that the non-driving regions 17 and 18 do not have the polarity of expansion and contraction. The non-driving region of the present invention is a region in which the piezoelectric element 20 cannot actively expand or contract. If the non-driving regions 17 and 18 are subjected to processing that prevents the piezoelectric element 20 from actively expanding or contracting, the piezoelectric element 20 itself may have or not have the polarity of expansion and contraction. For example, as described later, the piezoelectric element 20 in a part of the non-driving region 17 in which the detection phase electrode 7 is arranged needs the polarity of expansion and contraction. Therefore, as illustrated in FIG. 4B, the non-driving regions 17 and 18 are also preferred to have the polarity of expansion and contraction in parts.

In this case, the part of the non-driving region 17 in which the detection phase electrode 7 is arranged of the piezoelectric element 20 refers to a region in which lines perpendicular to the two electrode surfaces of the detection phase electrode 7 and the common electrode 2 intersect with the piezoelectric material. It is to be noted that, when the detection phase electrode 7 and the common electrode 2 are not arranged in parallel, the part refers to a region in which lines perpendicular to two electrode surfaces, that is, a surface of the detection phase electrode 7 and a surface of the common electrode 2 to which the detection phase electrode 7 is projected intersect with the piezoelectric material. In the following, when the expression "a part in which an electrode is arranged" is made, the expression has such a meaning. The same holds true for parts in which the drive phase electrodes 3 and 4 are arranged and a part in which the ground electrode 6 is arranged.

In this case, the processing that prevents the piezoelectric element 20 from actively expanding or contracting refers to, for example, as illustrated in the non-driving region 18 of FIG. 1A, processing of electrically connecting the common electrode 2 and the ground electrode 6 to each other through the diaphragm 9 that is made of a conductor and the short-circuiting wire 10. Even if the piezoelectric element 20 itself has the polarity of expansion and contraction, and the ground electrode 6 is supplied with electric power by any means, the piezoelectric element 20 does not actively expand or contract. Such processing is effective when the non-driving region 18 has the polarity of expansion and contraction as illustrated in FIG. 4B.

Further, other processing that prevents the piezoelectric element 20 from actively expanding or contracting is, for example, processing of preventing electrical connection between the electric wire 8a of the power feeding member 8 and one of the ground electrodes 5. Even when the power feeding member 8 is physically bonded to the non-driving region 17, and the piezoelectric element 20 itself has the polarity of expansion and contraction, the piezoelectric element 20 cannot actively expand or contract. Such processing is possible by subjecting a connection part between the power feeding member 8 and the ground electrode 5 to insulating processing, or removing a part of the electric wire 8a of the power feeding member 8 that is connected to the ground electrode 5. Such processing is effective when the non-driving region 17 has the polarity of expansion and contraction as illustrated in FIG. 4B.

Further, the processing that prevents the piezoelectric element 20 from actively expanding or contracting is, for example, processing of preventing electric power from being supplied from the drive circuit even when the electric wire 8a of the power feeding member 8 and the electrode are electrically connected to each other. Even when the piezoelectric element 20 itself has the polarity of expansion and contraction, the piezoelectric element 20 cannot actively expand or contract. Such processing is effective when the non-driving region 17 has the polarity of expansion and contraction as illustrated in FIG. 4B, and is processing preferred to be performed with respect to a detection region (detection phase) described later.

The electrode of the present invention is a conductor that is provided on any one of the surfaces of the annular one-piece piezoelectric material 1, and the resistance value thereof is less than 10Ω, preferably less than 1Ω. The resistance value of the electrode can be evaluated by measuring, for example, in the case of the common electrode 2, a resistance in the annular circumferential direction, that is, a resistance between a certain point of the common electrode and a certain point that is centrocymmetric with respect to the center of the annular shape by a multimeter (electric tester). Further, for example, in the case of the drive phase electrode 3, the resistance value thereof can be evaluated by measuring a resistance between most separated points in the annular circumferential direction by a multimeter (electric tester). Other electrodes may be evaluated by a similar method. Further, as the electrode of the present invention, Ag paste, an Ag fired electrode, an Au/Ti sputtered electrode, and the like are preferred because the thickness and the resistance value are small.

The electrode of the present invention may be a laminate of multiple electrodes as long as the electrode has a part that is directly provided on any one of the surfaces of the piezoelectric material 1. For example, as described above, the piezoelectric material 1 in the driving regions 15 and 16 of the piezoelectric element 20 is subjected to polarization processing of reversing the polarity alternately at λ/2 pitches along the annular direction. That is, as illustrated in FIGS. 4A and 4B, the polarity of expansion and contraction of the piezoelectric element 20 varies. In order to perform such polarization processing, it is preferred to perform the polarization processing under a state in which multiple polarizing electrodes (polarizing electrodes 33) are provided on one surface of the piezoelectric material 1 (for example, the first surface of the piezoelectric element 20 illustrated in FIG. 3A), and the common electrode 2 is provided on the other surface of the piezoelectric material 1 (for example, the second surface of the piezoelectric element 20 illustrated in FIG. 3C). Each of the drive phase electrodes 3 and 4 can be obtained by connecting the multiple polarizing electrodes with use of individual electrodes, or overlapping another electrode onto the multiple polarizing electrodes from above.

Meanwhile, the drive phase electrodes 3 and 4 of the present invention are required to be arranged across not only the driving regions 15 and 16 but also the non-driving region 17. Therefore, electrodes (for example, driving phase power supply electrodes 34 of FIG. 10B) are also provided in the non-driving region 17, and the electrodes provided in the non-driving region 17 and the multiple polarizing electrodes may be connected with use of other electrodes, or other electrodes may be overlapped onto those electrodes from above, to thereby obtain the drive phase electrodes 3 and 4. In the present invention, the power feeding member 8 is required to be electrically connected surely to each electrode in the non-driving region 17. Therefore, obtaining the drive phase electrodes 3 and 4 by overlapping other electrodes is an exemplary embodiment of the present invention.

It is to be noted that, when the drive phase electrodes 3 and 4 are obtained by overlapping other electrodes onto the multiple polarizing electrodes provided in the driving regions 15 and 16 and the electrodes provided in the non-driving region 17 from above, those electrodes may be made of the same material or different materials, or may be made of the same material but produced by different methods. Further, even when the drive phase electrodes 3 and 4 are obtained by connecting those individual electrodes with use of individual electrodes, the individual electrodes for connection may be made of the same material or different materials, or may be made of the same material but produced by different methods. It is only required that the electrode provided subsequently have a part to be directly provided on any one of the surfaces of the annular one-piece piezoelectric material 1, and the resistance value of the electrode be less than 10Ω, preferably less than 1Ω.

The driving regions 15 and 16 and the non-driving regions 17 and 18 can be identified through verification by the following method. As illustrated in FIGS. 3A and 3C, the non-driving region 18 is sandwiched between the drive phase electrodes 3 and 4. In this case, when the middle point of a boundary portion between the drive phase electrode 3 or 4 and the ground electrode 6 is set as an origin, the average annular length of the non-driving region 18 is understood. For example, in the case of the annular piezoelectric element illustrated in FIGS. 3A to 3C, when the radial middle point along the edge of the ground electrode 6 at the boundary portion between the drive phase electrode 3 or 4 and the ground electrode 6 is set as an origin, a length of an arc centered at the center of the ring of the annular piezoelectric element may be measured to achieve the average annular length. As described above, the average annular length of the non-driving region 18 is $\lambda/4$. Next, the average annular length of the piezoelectric element 20 is confirmed. In the case of the piezoelectric element 20 used in the present invention illustrated in FIGS. 3A to 3C, the average annular length is $7\lambda$ (about 28 times the average annular length of the non-driving region 18). Meanwhile, the average annular length of each of the driving regions 15 and 16 is an integer multiple of $\lambda/2$. Further, in the vibration wave drive device 25 of the present invention, the power feeding member 8 is arranged only in the non-driving region 17. In view of this, it can be visibly confirmed that the non-driving region 17 has a length that is about 3 times the length of the non-driving region 18. Therefore, in the piezoelectric element 20 used in the present invention illustrated in FIGS. 3A to 3C, the non-driving region 17 is $3\lambda/4$. Therefore, it is understood that the average annular length of each of the driving regions 15 and 16 is half of $7\lambda-(\lambda/4+3\lambda/4)=6\lambda$, that is, $3\lambda$. Therefore, in the piezoelectric element 20 used in the present invention illustrated in FIGS. 3A to 3C, when the middle point of the boundary portion between the drive phase electrode 3 or 4 and the ground electrode 6 is set as an origin, a region in a range of the average annular length of $3\lambda$ can be identified to be the driving region 15 or 16 of the present invention.

In the vibration wave drive device of the present invention, the non-driving region has an average annular length of $n\lambda/4$ (n is an odd number), and n is preferred to be 1 or 3.

In the vibration wave drive device 25 of the present invention, the power feeding member 8 is electrically connected to the drive phase electrodes 3 and 4 provided on the first surface of the piezoelectric element 20 only in the non-driving region 17.

Therefore, as the average annular length of the non-driving region 17 becomes smaller, the power feeding member 8 can be downsized, which enables further reduction in cost of the power feeding member 8. Further, in the piezoelectric elements having the same average annular length, as the average annular length of each of the non-driving regions 17 and 18 becomes smaller, the average annular length of each of the driving regions 15 and 16 becomes larger. Therefore, the vibration performance of the stator 30 for a vibration wave motor improves. Further, the non-driving regions 17 and 18 are regions in which the piezoelectric element 20 cannot actively expand or contract, but are regions that vibrate due to transmission of vibration generated by the driving regions 15 and 16. Therefore, as the average annular length of each of the non-driving regions 17 and 18 becomes smaller, the vibration generated through transmission can be more prevented from being suppressed by the power feeding member 8, and thus the vibration performance of the stator 30 for a vibration wave motor improves. As described above, the average annular length is preferred to be smaller, and n is preferred to be 1 or 3. n is more preferred to be 1.

Meanwhile, in order to achieve more preferred configurations as the stator 30 for a vibration wave motor and a vibration wave motor 40, the non-driving region 17 of the vibration wave drive device 25 of the present invention may have both of a function as a detection region (detection phase) as described later and a function of electrically connecting the common electrode 2 and the electric wire $8a$ of the power feeding member 8 to each other. When the non-driving region has such functions, n may be 3.

Further, as long as the quality of the vibration wave is satisfied, regarding the connection of the power feeding member 8 and the non-driving region, even when the power feeding member 8 is connected so as to slightly exceed the non-driving region, it may be regarded that the power feeding member is electrically connected only in the non-driving region. However, it is desired that the allowance of the arrangement be about 5% or less with respect to the wavelength $\lambda$, and more preferred to be decreased to 3% or less.

The vibration wave drive device of the present invention is preferred to satisfy the following relationship, $$0 \leq d(2) < 0.1 d(1),$$

where $d(1)$ represents an absolute value of a piezoelectric constant of each of the driving regions and $d(2)$ represents an absolute value of a piezoelectric constant of a part of the non-driving region, which includes the electrode arranged across the corresponding one of the driving regions and the non-driving region.

In the vibration wave drive device 25 of the present invention, the drive phase electrodes 3 and 4 are arranged across not only the driving regions 15 and 16 but also the non-driving region 17. Therefore, parts of the non-driving region 17 in which the drive phase electrodes 3 and 4 are arranged are supplied with electric power through the electric wire $8a$ of the power feeding member 8. However, it is necessary to prevent the piezoelectric element 20 from actively expanding or contracting in the non-driving region 17. For example, processing such as reducing the piezoelectric constant of each of the parts of the non-driving region 17 in which the drive phase electrodes 3 and 4 are arranged (absolute value $d(2)$ of the piezoelectric constant) is required. Further, for example, devices such as changing the arrangement of the common electrode 2 to remove the common electrode 2 from regions in which lines perpendicular to the parts of the non-driving region 17 in which the drive phase electrodes 3 and 4 are arranged intersect with the piezoelectric material are required.

In the stator 30 for a vibration wave motor of the present invention, the latter method of changing the arrangement of the common electrode 2 requires a countermeasure against the risk that a voltage may be applied through the diaphragm 9, and hence is not preferred in terms of productivity and cost. On the other hand, in the case of the former method of reducing $d(2)$, as long as $d(2)$ is sufficiently smaller than the piezoelectric constant of the driving regions 15 and 16 (absolute value $d(1)$ of the piezoelectric constant), even if $d(2)$ is not completely 0, an untroubled traveling wave can be generated. In this case, "sufficiently small" refers to a case where $d(2) < 0.1 d(1)$ is satisfied.

Meanwhile, when the piezoelectric material 1 is not subjected to polarization processing, the inverse piezoelectric effect does not occur. Further, when the polarization processing is insufficient, the inverse piezoelectric effect is small. Further, when the piezoelectric material 1 is subjected to heating treatment at a temperature equal to or higher than the Curie temperature (Tc) or at a temperature equal to or higher than the depolarization temperature (Td) of the piezoelectric material, the inverse piezoelectric effect markedly reduces. Further, even when the temperature is equal to or smaller than the Curie temperature or equal to or smaller than the depolarization temperature, the inverse piezoelectric effect is reduced as compared to the case where heating treatment is not performed when the temperature is in the vicinity thereof. As described above, the degree of the inverse piezoelectric effect varies even in the same piezoelectric material depending on polarization processing conditions, heating treatment conditions, and the like. Further, when only a part of the one-piece piezoelectric material is subjected to processing such as heating treatment at a temperature equal to or higher than the Curie temperature or equal to or higher than the depolarization temperature, the degree of the inverse piezoelectric effect partially varies even in the one-piece piezoelectric material. The piezoelectric constant of the present invention refers to such a piezoelectric constant of a certain part of the one-piece piezoelectric material.

A method of evaluating the absolute value d(1) of the piezoelectric constant and the absolute value d(2) of the piezoelectric constant of the present invention is as follows. First, in the stator 30 for a vibration wave motor of the present invention, the vibration wave drive device 25 is removed from the diaphragm 9, and next the piezoelectric element 20 is removed from the power feeding member 8. Then, a desired part of the piezoelectric element 20 is cut for evaluation by a Berlincourt method. Specifically, when the absolute value d(1) of the piezoelectric constant is evaluated, it is preferred that a substantially center part of each of the driving regions 15 and 16 be cut for evaluation by a Berlincourt method. Further, when the absolute value d(2) of the piezoelectric constant is evaluated, it is preferred that whole parts of the non-driving region 17 in which the drive phase electrodes 3 and 4 are arranged be cut for evaluation by a Berlincourt method. In the evaluation by the Berlincourt method, there is no influence of an area of a cut part in principle, but it is preferred that both of the cut areas be substantially the same for comparison.

The piezoelectric constant that can be evaluated by the Berlincourt method is the d33 constant by the direct piezoelectric effect. On the other hand, in the stator 30 for a vibration wave motor of the present invention, the diaphragm is vibrated by a strain generated in the annular direction, that is, a plane perpendicular to an electric field by the inverse piezoelectric effect. Therefore, the piezoelectric constant d to be evaluated is preferred to be the d31 or d32 constant measured with use of the inverse piezoelectric effect. However, the present invention has no problem in practical use as long as the absolute value d(1) of the piezoelectric constant and the absolute value d(2) of the piezoelectric constant can be relatively compared to each other. Therefore, by evaluating the absolute value of the d33 constant by the above-mentioned method, the piezoelectric constants can be compared to each other.

In the vibration wave drive device of the present invention, it is preferred that the non-driving region include a detection region for detecting the vibration of the vibration wave drive device, and the piezoelectric element further include a detection phase electrode arranged on the first surface of the detection region, the detection phase electrode being electrically connected to the power feeding member.

In the diaphragm 9 of the stator 30 for a vibration wave motor of the present invention, a traveling wave that travels in the annular direction is generated. Meanwhile, the vibration of the stator 30 for a vibration wave motor is also transmitted to the non-driving region 17. The detection region (detection phase) of the present invention refers to a region for detecting the vibration generated in the non-driving region 17 through transmission of the vibration generated by the stator 30 for a vibration wave motor of the present invention. A strain is generated in the piezoelectric element 20 of the detection region in accordance with the generated vibration. The piezoelectric element 20 outputs a voltage in accordance with the amount of the generated strain by the direct piezoelectric effect. That is, the vibration state of the piezoelectric element 20 used in the present invention can be output as an electrical signal.

As described above, the vibration wave drive device 25 of the present invention includes the detection region, and thus the vibration state of the stator 30 for a vibration wave motor of the present invention can be detected as an electrical signal. The electrical signal is input to, for example, a phase detection circuit in a driving control system of the present invention to be described later, to thereby be used for drive control of the vibration wave motor 40 of the present invention.

Meanwhile, the detection region is not supplied with electric power from the drive circuit, and hence the detection region is a region in which the piezoelectric element cannot actively expand or contract. However, the piezoelectric element needs to output a voltage in accordance with the amount of the strain generated in the detection region. Therefore, the piezoelectric element of the detection region requires the polarity of expansion and contraction. The detection region is provided in the non-driving region along the annular direction with a length that is other than an integral multiple of the wavelength $\lambda$.

Specifically, in the piezoelectric element 20 of the vibration wave drive device 25 of the present invention illustrated in FIGS. 3A to 3C, the detection region is provided in a region of the non-driving region 17, in which lines perpendicular to the two electrode surfaces of the detection phase electrode 7 and the common electrode 2 intersect with the piezoelectric material 1, that is, a region in which the detection phase electrode 7 is arranged. The detection region has, for example, the polarity of expansion and contraction of "−" illustrated in FIG. 4B, and the average annular length is $\lambda/4$. The detection phase electrode 7 is arranged at a position sandwiched between the ground electrodes 5 on the first surface (surface illustrated in FIG. 3A) of the non-driving region 17. In the vibration wave drive device 25 of the present invention illustrated in FIGS. 2A to 2C, the detection phase electrode 7 is electrically connected to the electric wire 8a of the power feeding member 8. The detection phase electrode 7 is not supplied with electric power from the drive circuit. That is, the detection region is subjected to processing that prevents the piezoelectric element 20 from actively expanding or contracting.

The detection phase electrode 7 is formed on the first surface of the non-driving region 17, and hence when the drive phase electrodes 3 and 4 are electrically connected to the power feeding member 8, at the same time, the detection phase electrode 7 can be electrically connected to the electric wire 8a of the power feeding member 8. It is to be noted that, the detection region may be provided at any position as long as the detection region is provided in the non-driving region along the annular direction with a length other than an integral multiple of the wavelength λ. Further, the detection phase electrode may also be provided at any position as long as the detection phase electrode is provided in the non-driving region along the annular direction with a length other than an integral multiple of the wavelength λ.

In the vibration wave drive device of the present invention, it is preferred that, when a surface opposed to the first surface is referred to as a second surface, the piezoelectric element include a ground electrode arranged on the first surface of the non-driving region, the ground electrode being electrically connected to an electrode on the second surface and being electrically connected to the power feeding member.

In the vibration wave drive device 25 of the present invention, the common electrode 2 is maintained at the ground potential, and electric power is supplied to the drive phase electrodes 3 and 4 through the electric wire 8a of the power feeding member 8. Thus, voltages can be applied to the driving regions 15 and 16 of the piezoelectric element 20. Further, the common electrode 2 is maintained at the ground potential, and a voltage in accordance with the amount of strain generated in the detection region is output from the detection phase electrode 7 through the electric wire 8a of the power feeding member 8. Thus, the vibration state of the piezoelectric element 20 can be output as an electrical signal. That is, it is preferred to maintain the common electrode 2 at the ground potential. Therefore, for example, in the driving control system of the present invention to be described later, the common electrode 2 is grounded through a control circuit.

In order to ground the common electrode 2 through the control circuit, it is preferred to electrically connect the common electrode 2 to the electric wire 8a of the power feeding member 8. Meanwhile, as illustrated in FIG. 3A to 3C, in the piezoelectric element 20 used in the present invention, the common electrode 2 is provided on the second surface of the piezoelectric element 20, and is arranged in an annular shape across the driving regions 15 and 16 and the non-driving regions 17 and 18. On the other hand, as illustrated in FIGS. 2A to 2C, in the vibration wave drive device 25 of the present invention, the power feeding member 8 is provided on the first surface of the piezoelectric element 20.

The ground electrode 5 is an electrode provided so as to electrically connect the electric wire 8a of the power feeding member 8 provided on the first surface of the piezoelectric element 20 to the common electrode 2 provided on the second surface of the piezoelectric element 20.

In an example of the piezoelectric element 20 of the vibration wave drive device 25 of the present invention illustrated in FIGS. 3A to 3C, two ground electrodes 5 are arranged on the first surface (surface illustrated in FIG. 3A) of the non-driving region 17 at positions sandwiched between the detection phase electrode 7 and the drive phase electrodes 3 and 4. Further, the ground electrode 6 is arranged on the first surface (surface illustrated in FIG. 3A) of the non-driving region 18 at a position sandwiched between the drive phase electrodes 3 and 4. In the vibration wave drive device 25 of the present invention illustrated in FIGS. 2A to 2C, the two ground electrodes 5 are electrically connected to the electric wire 8a of the power feeding member 8. The parts in which the ground electrodes 5 are arranged may have or not have the polarity of expansion and contraction. It is to be noted that, when the parts in which the ground electrodes 5 are arranged have the polarity of expansion and contraction, it is necessary to subject the parts to processing that prevents the piezoelectric element 20 from actively expanding or contracting.

Examples of preferred processing for the parts in which the ground electrodes 5 and 6 are arranged to prevent the piezoelectric element 20 from actively expanding and contracting include, as illustrated in FIG. 1A, processing of electrically connecting the common electrode 2 and the ground electrode 6 to each other through the diaphragm 9 that is made of a conductor and the short-circuiting wire 10, processing of preventing the electric wire 8a of the power feeding member 8 and the ground electrode 5 from electrically connecting to each other, and processing of preventing electric power from being supplied from the drive circuit even if the electric wire 8a of the power feeding member 8 and an electrode are electrically connected to each other.

In the stator 30 for a vibration wave motor of the present invention, the common electrode 2 is electrically connected to the ground electrodes 5 through the diaphragm 9 that is made of a conductor and the short-circuiting wire 10. The ground electrodes 5 are present on the first surface of the non-driving region 17, and hence, when the drive phase electrodes 3 and 4 are electrically connected to the power feeding member 8, at the same time, the ground electrodes 5 can be electrically connected to the power feeding member 8. As a result, the common electrode 2 can be easily electrically connected to the electric wire 8a of the power feeding member 8, and the common electrode 2 can be easily maintained at the ground potential.

In the stator 30 for a vibration wave motor of the present invention illustrated in FIGS. 1A to 1C, the common electrode 2 is electrically connected to the two ground electrodes 5 through the diaphragm 9 that is made of a conductor and the short-circuiting wire 10, but the common electrode 2 may be electrically connected to one of the two ground electrodes 5. Further, the common electrode 2 is electrically connected to the ground electrode 6 through the diaphragm 9 that is made of a conductor and the short-circuiting wire 10, but the common electrode 2 may not be electrically connected to the ground electrode 6. Further, in the piezoelectric element 20 used in the present invention illustrated in FIGS. 3A to 3C, two ground electrodes 5 are arranged on the first surface (surface illustrated in FIG. 3A) of the non-driving region 17 at positions sandwiched between the detection phase electrode 7 and the drive phase electrodes 3 and 4, but the number of the ground electrodes 5 may be 1 or 3 or more, and the ground electrode 5 may be arranged at any position in the non-driving region 17. The same holds true for the ground electrode 6. In this case, in the stator 30 for a vibration wave motor of the present invention illustrated in FIGS. 1A to 1C, the diaphragm 9 is made of a conductor, but the diaphragm 9 may be made of an insulator when the common electrode 2 and the ground electrode 5 are electrically connected to each other. That is, in the stator 30 for a vibration wave motor of the present invention, it is only required that the common electrode 2 be electrically connected to at least one ground electrode 5, and it is only required that the at least one ground electrode electrically connected to the common electrode 2 be electrically connected to the electric wire 8a of the power feeding member 8.

In the vibration wave drive device of the present invention, it is preferred that the power feeding member be a flexible printed board.

In the stator 30 for a vibration wave motor according to one embodiment of the present invention illustrated in FIGS. 1A to 1C, the power feeding member 8 is provided only on the first surface of the non-driving region 17. A flexible printed board 8 (which means the power feeding member 8 formed of the flexible printed board) includes a wiring foil corresponding to the electric wire 8a and a base film corresponding to the insulator 8b. The flexible printed board 8 can be connected with use of an epoxy adhesive or the like, but it is preferred that conductive anisotropic conductive paste (ACP) or anisotropic conductive film (ACF) be thermocompression-bonded so as to reduce failure in electrical connection.

The flexible printed board 8 has a high dimensional accuracy, and can be easily positioned with use of a jig or the like. Therefore, when the flexible printed board 8 is used as the power feeding member 8, it is possible to prevent reduction in quality due to the fluctuation in vibration performance of the stator 30 for a vibration wave motor, which is caused by the positional fluctuation or the like when the power feeding member 8 is connected to the piezoelectric element 20.

When thermocompression bonding is used for connection of the flexible printed board 8, it is preferred to select a piezoelectric material 1 whose Curie temperature or depolarization temperature is substantially equal to or lower than the thermocompression bonding temperature. In such a piezoelectric material, even when the parts of the non-driving region 17 in which the drive phase electrodes 3 and 4 are arranged across have the polarity of expansion and contraction, processing that prevents active expansion or contraction can be easily made.

As described above, when the piezoelectric material is subjected to heating treatment at a temperature equal to or higher than the Curie temperature (Tc) or the depolarization temperature (Td) of the piezoelectric material, the piezoelectric constant markedly reduces. Therefore, with the thermocompression bonding temperature for connection of the flexible printed board 8, the piezoelectric constant (absolute value d(2) of the piezoelectric constant) of the parts of the non-driving region 17 in which the drive phase electrodes 3 and 4 are arranged across can be reduced. Thus, the relationship of the absolute value d(1) of the piezoelectric constant of the driving region and the piezoelectric constant (absolute value d(2) of the piezoelectric constant) of the parts of the non-driving region 17 in which the drive phase electrodes 3 and 4 are arranged across can be easily set to 0≤d(2)<0.1d(1).

As described above, according to one embodiment of the present invention which is optimum as a vibration wave drive device, there is provided a vibration wave drive device, including: an annular piezoelectric element including a one-piece piezoelectric material and multiple electrodes provided so as to sandwich the one-piece piezoelectric material, the annular piezoelectric element being configured to vibrate by a traveling wave of a wavelength λ; and a power feeding member including a flexible printed board including at least electric wire for supplying electric power to the annular piezoelectric element, the power feeding member being provided on a first surface of the annular piezoelectric element. The annular piezoelectric element includes at least two driving regions, and a non-driving region that is arranged between two of the at least two driving regions and has an average annular length of nλ/4, where n is an odd number. At least one electrode provided on the first surface is arranged across the non-driving region and corresponding one of the at least two driving regions, and is electrically connected to the power feeding member only in the non-driving region. Further, the following relationship is satisfied, 0≤d(2)<0.1d(1), where d(1) represents an absolute value of a piezoelectric constant of each of the at least two driving regions and d(2) represents an absolute value of a piezoelectric constant of a part of the non-driving region, which includes the at least one electrode arranged across the corresponding one of the at least two driving regions and the non-driving region. Further, the non-driving region includes a detection region for detecting vibration of the vibration wave drive device, and the vibration wave drive device further includes a detection phase electrode and a ground electrode that are arranged on the first surface of the non-driving region and are electrically connected to the power feeding member. Further, the ground electrode is electrically connected to a common electrode on a second surface.

On the other hand, FIGS. 5A, 5B, 5C and 5D are schematic views illustrating the stator 30 for a vibration wave motor according to another exemplary embodiment of the present invention, and are schematic views illustrating, in an enlarged manner, the vicinity of the non-driving region 17 of the stator 30 for a vibration wave motor of the present invention.

Figure 5A:
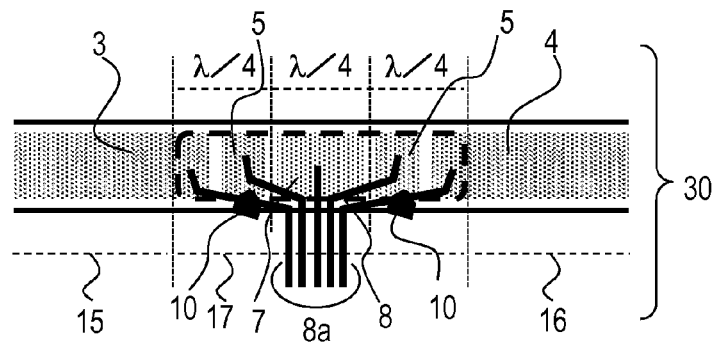
FIGS. 5A, 5B, 5C and 5D are schematic views illustrating, in an enlarged manner, the vicinity of a non-driving region of the stator for a vibration wave motor of the present invention.
Figure 5B:
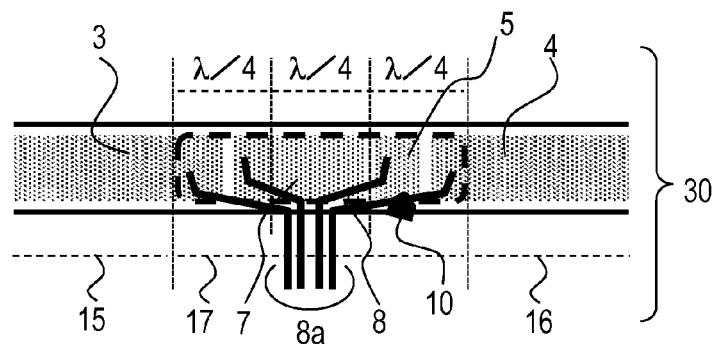
Figure 5C:
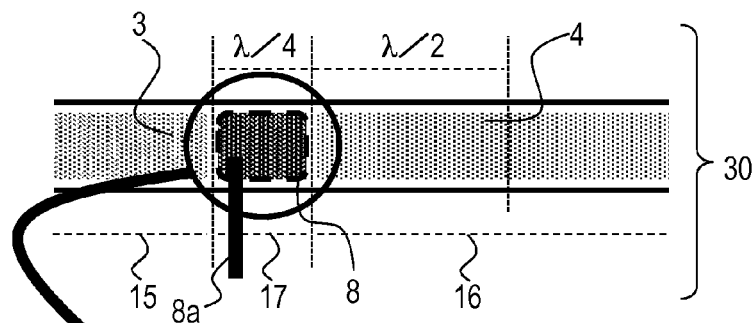
Figure 5D:
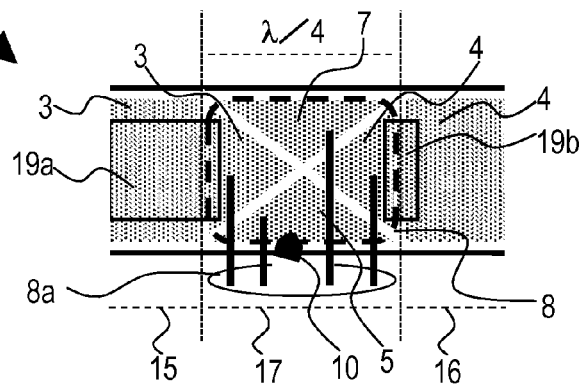

In the stator 30 for a vibration wave motor of the present invention, the non-driving region 17 having the average annular length of 3λ/4 may include multiple ground electrodes 5 as illustrated in FIG. 5A, or may include a single ground electrode 5 as illustrated in FIG. 5B. Further, the non-driving region 17 having the average annular length of 3λ/4 may include the detection phase electrode 7 having the average annular length of λ/4 as illustrated in FIG. 5A, or the average annular length may be other than λ/4 as long as the average annular length is other than A as illustrated in FIG. 5B. Further, the non-driving region 17 having the average annular length of λ/4 may include both of the detection phase electrode 7 and the ground electrode 5 as illustrated in FIGS. 5C and 5D, or the electrodes may be separately provided in the driving regions 15 and 16 and the non-driving region 17, and then the multiple electrodes may be separately connected with use of connection electrodes 19a and 19b, to thereby obtain the drive phase electrodes 3 and 4.

As described above, as long as the electrode provided subsequently has a part that is directly provided on at least one of the surfaces of the annular one-piece piezoelectric material 1, the electrode may overlap with the electrode provided previously. It is to be noted that, when, as illustrated in FIGS. 5C and 5D, the electrodes are separately provided in the driving regions 15 and 16 and the non-driving region 17, and then the multiple electrodes are separately connected with use of the connection electrodes 19a and 19b, to thereby obtain the drive phase electrodes 3 and 4, it is preferred that the parts of the non-driving region 17 in which the drive phase electrodes 3 and 4 are arranged do not have the polarity of expansion and contraction.

As the piezoelectric material 1 of the present invention, there may be used, for example: piezoelectric ceramics such as lead zirconate titanate (PZT), barium titanate, barium calcium titanate, bismuth sodium titanate, lead titanate, lithium niobate, potassium sodium niobate, and bismuth ferrite; and a piezoelectric ceramics containing any one of these ceramics as a main component. It is preferred that the piezoelectric material 1 contain, as its main component, a perovskite-type metal oxide represented by the following general formula (1):

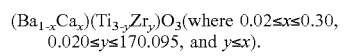

$(Ba_{1-x}Ca_x)(Ti_{3-y}Zr_y)O_3$ (where 0.02≤x≤0.30, 0.020≤y≤170.095, and y≤x).

The perovskite-type metal oxide refers to a metal oxide having a perovskite-type structure that is ideally a cubic structure as described in Iwanami Dictionary of Physics and Chemistry, 5th Edition (Iwanami Shoten, Publishers, published on Feb. 20, 1998). A metal oxide having a perovskite-type structure is generally represented by a chemical formula of $ABO_3$. In the perovskite-type metal oxide, elements A and B occupy particular positions of unit cells called an A site and a B site, respectively, in the shape of ions. For example, in the case of a unit cell of a cubic structure, an A element occupies a vertex of the cube and a B element occupies the body-centered position of the cube. An O element occupies the face-centered position of the cube as an anion of oxygen.

A metal oxide represented by the above-mentioned general formula (1) means that metal elements positioned at an A site are Ba and Ca and metal elements positioned at a B site are Ti and Zr. It is to be noted that, a part of Ba and Ca may be positioned at the B site. Similarly, a part of Ti and Zr may be positioned at the A site.

A molar ratio between the elements at the B site and the O element in the general formula (1) is 1:3. Even the case where the molar ratio is slightly shifted (for example, 1.00:2.94 to 1.00:3.06) can be included in the scope of the present invention, if the metal oxide has a perovskite-type structure as a main phase.

It can be determined from structural analysis, for example, by X-ray diffraction or electron diffraction that a metal oxide has a perovskite-type structure.

In the general formula (1), "x" representing a molar ratio of Ca at the A site is within a range of $0.02 \le x \le 0.30$. When the "x" is smaller than 0.02, a dielectric loss (tan δ) increases. When the dielectric loss increases, heat generated when the piezoelectric element 20 is supplied with a voltage to be driven increases, and there is a possibility that driving efficiency may be reduced. On the other hand, when the "x" is larger than 0.30, there is a possibility that piezoelectric characteristics may not be sufficient.

In the general formula (1), "y" representing a molar ratio of Zr at the B site is within a range of $0.020 \le y \le 170.095$. When the "y" is smaller than 0.020, piezoelectric characteristics may not be sufficient. On the other hand, when the "y" is larger than 0.095, the Curie temperature (Tc) becomes less than 85° C., and there is a possibility that the inverse piezoelectric effect of the piezoelectric material 1 may disappear at high temperature.

The Curie temperature (Tc) of the present invention refers to a temperature at which ferroelectricity of the piezoelectric material 1 disappears. This is specified by a method of directly measuring a temperature at which ferroelectricity of the piezoelectric material disappears, and a method of measuring a dielectric constant of the piezoelectric material through use of a minute alternating electric field and determining a temperature at which ferroelectricity of the piezoelectric material disappears from a temperature at which the dielectric constant exhibits maximum. Further, in the present invention, the depolarization temperature (Td) refers to a temperature at which the inverse piezoelectric effect of the piezoelectric material 1 markedly reduces. This is specified by a method of first measuring, at room temperature, a piezoelectric constant of a polarized piezoelectric material after elapse of a sufficient time from the termination of the polarization processing, next heating the piezoelectric material from room temperature to a certain temperature (for example, Td), and then measuring the piezoelectric constant at room temperature again. In the present invention, the depolarization temperature Td refers to a temperature at which the piezoelectric constant after heating becomes 95% or less of the piezoelectric constant before heating.

In the general formula (1), the molar ratio x of Ca and the molar ratio y of Zr are within a range of $y \le x$.

When $y > x$, a dielectric loss increases and an insulation property may not become sufficient. Further, when the ranges of x and y are satisfied simultaneously, a phase transition temperature T can be moved from the vicinity of room temperature to temperature equal to or lower than driving temperature, and the piezoelectric element 20 can be driven stably in a wide temperature range.

Further, in the general formula (1), it is preferred that a ratio A1/B1 of the molar quantity of Ba and Ca at the A site and the molar quantity of Ti and Zr at the B site be within a range of $1.00 \le A1/B1 \le 1.01$. When the A1/B1 is smaller than 1.00, abnormal grains grow easily, and the mechanical strength of the piezoelectric material 1 may decrease. On the other hand, when the A1/B1 becomes larger than 1.01, temperature required for the growth of grains becomes too high, and density does not increase sufficiently in a general baking furnace, and a large number of pores and defects may be present in the piezoelectric material 1.

There is no particular limit to means for measuring a composition of the piezoelectric material 1. Examples of the means include X-ray fluorescence analysis, ICP emission spectrochemical analysis, and atomic absorption analysis. In any means, a weight ratio and a composition ratio of elements contained in the piezoelectric material 1 can be calculated.

It is preferred that the piezoelectric material 1 contain the perovskite-type metal oxide represented by the general formula (1) as its main component, that the metal oxide contain Mn, and that the content of the Mn be 0.02 parts by weight or more to 0.40 parts by weight or less on a metal basis with respect to 100 parts by weight of the metal oxide.

When the metal oxide contains an amount of Mn, which falls within the above-mentioned range, an insulation property and a mechanical quality factor Qm are enhanced. In this case, the mechanical quality factor Qm refers to a factor representing an elastic loss caused by vibration when the piezoelectric element is evaluated as a vibrator, and the magnitude of the mechanical quality factor is observed as a sharpness of the resonance curve in impedance measurement. That is, the mechanical quality factor Qm is a constant representing the sharpness of resonance of the piezoelectric element. When the mechanical quality factor Qm is high, the amount of strain of the piezoelectric element in the vicinity of the resonance frequency further increases, and hence the piezoelectric element can be effectively vibrated.

It is considered that the enhancement of an insulation property and a mechanical quality factor are derived from the generation of an internal electric field caused by the introduction of defective dipoles by Mn having a different valence from those of Ti and Zr. In the case where an internal electric field is present, the reliability of the piezoelectric element 20 can be ensured when the piezoelectric element 20 is supplied with a voltage to be driven.

In this case, the value on a metal basis representing the content of Mn refers to a value obtained by converting the elements constituting the metal oxide represented by the general formula (1) on an oxide basis from the contents of the respective metals of Ba, Ca, Ti, Zr, and Mn measured by X-ray fluorescence analysis (XRF), ICP emission spectrochemical analysis, atomic absorption analysis, or the like from the piezoelectric material 1, and calculating a ratio of the Mn weight with respect to the total weight of the elements (assumed to be 100).

When the content of Mn is less than 0.02 parts by weight, the effect of polarization processing required for driving the piezoelectric element 20 is not sufficient. On the other hand, it is not preferred that the content of Mn be more than 0.40 parts by weight, because the piezoelectric characteristics are not sufficient, and a crystal having a hexagonal structure that does not contribute to the piezoelectric characteristics appears.

Mn is not limited to a metal Mn and only needs to be contained in a piezoelectric material as a Mn component, and the contained form of Mn is not particularly limited. For example, Mn may be dissolved in the B site or may be contained in a grain boundary. Alternatively, the Mn component may be contained in the piezoelectric material 1 in the form of a metal, an ion, an oxide, a metal salt, a complex, or the like. The more preferred contained form is a solid solution of the Mn component at the B site, from the viewpoint of an insulation property and sinterability. In the case where the Mn component is dissolved at the B site, a preferred range of A2/B2 is $0.993 \leq A2/B2 \leq 0.998$, where A2/B2 is a ratio between the molar quantity of Ba and Ca at the A site and the molar quantity of Ti, Zr, and Mn at the B site.

The piezoelectric material 1 may contain components (hereinafter referred to as "auxiliary components") other than the metal oxide represented by the general formula (1) and Mn within a range not varying characteristics of the piezoelectric material 1. It is preferred that the total amount of the auxiliary components be less than 1.2 parts by weight with respect to 100 parts by weight of the metal oxide represented by the general formula (1). When the amount of the auxiliary components exceeds 1.2 parts by weight, there is a possibility that the piezoelectric characteristics and insulation property of the piezoelectric material 1 may be reduced. Further, it is preferred that, of the auxiliary components, the content of metal elements other than Ba, Ca, Ti, Zr, and Mn be 1.0 part by weight or less on an oxide basis or 0.9 parts by weight or less on a metal basis with respect to the piezoelectric material 1. The metal elements of the present invention include metalloid elements such as Si, Ge, and Sb. When, of the auxiliary components, the content of metal elements other than Ba, Ca, Ti, Zr, and Mn exceeds 1.0 part by weight on an oxide basis or 0.9 parts by weight on a metal basis with respect to the piezoelectric material 1, there is a possibility that the piezoelectric characteristics and insulation property of the piezoelectric material 1 may be reduced markedly. It is preferred that, of the auxiliary components, the total amount of Li, Na, Mg, and Al elements be 0.5 parts by weight or less on a metal basis with respect to the piezoelectric material 1. When, of the auxiliary components, the total amount of Li, Na, Mg, and Al elements exceeds 0.5 parts by weight on a metal basis with respect to the piezoelectric material 1, there is a possibility that sintering may be insufficient. It is preferred that, of the auxiliary components, the total amount of Y and V elements be 0.2 parts by weight or less on a metal basis with respect to the piezoelectric material 1. When, of the auxiliary components, the total amount of Y and V elements exceeds 0.2 parts by weight on a metal basis with respect to the piezoelectric material 1, there is a possibility that polarization processing may be difficult.

Examples of the auxiliary components include sintering aids such as Si and Cu. Further, Sr and Mg that are contained in commercially available materials of Ba and Ca as inevitable components may be contained in the piezoelectric material of the present invention. Similarly, Nb contained in a commercially available material of Ti as an inevitable component and Hf contained in a commercially available material of Zr as an inevitable component may be contained in the piezoelectric material 1 of the present invention.

There is no particular limit to means for measuring the parts by weight of the auxiliary components. Examples of the means include X-ray fluorescence analysis (XRF), ICP emission spectrochemical analysis, and atomic absorption analysis.

Next, a vibration wave motor of the present invention is described. The vibration wave motor of the present invention has a feature of including at least the stator for a vibration wave motor and a rotor provided in contact with the vibrating surface of the diaphragm.

Figure 6A:
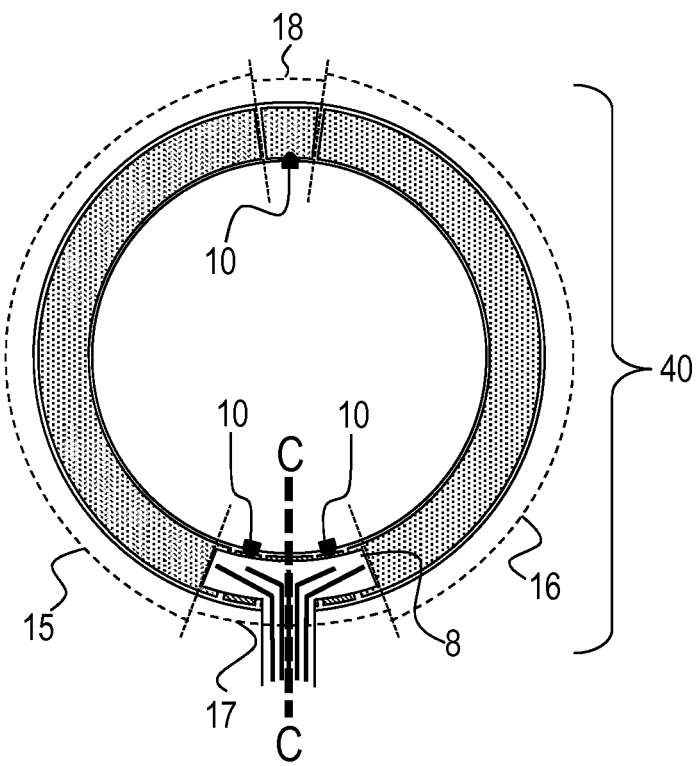
FIGS. 6A and 6B are schematic views illustrating a configuration of a vibration wave motor of the present invention.
Figure 6B:
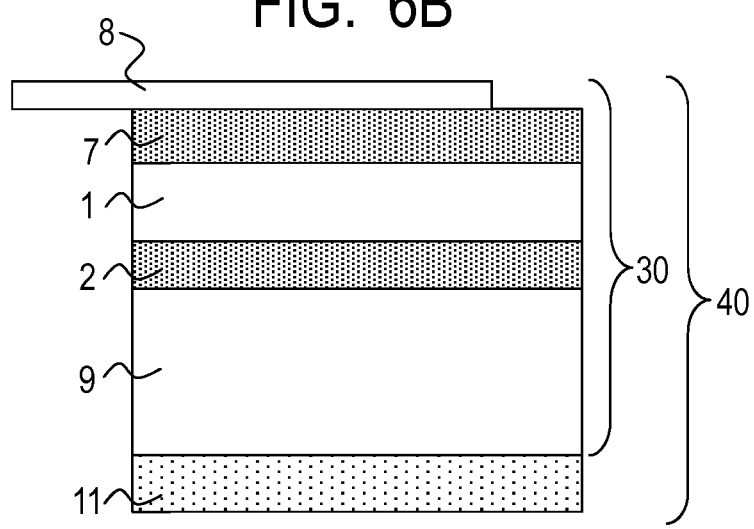

FIGS. 6A and 6B are schematic views illustrating the configuration of a vibration wave motor according to one embodiment of the present invention. FIG. 6A is a schematic plan view of the vibration wave motor, and FIG. 6B is a sectional view of the vibration wave motor taken along the line C-C of FIG. 6A.

In the vibration wave motor 40 of this embodiment, as illustrated in FIG. 6B, a rotor 11 that is the rotor is provided on a surface of the diaphragm 9 of the stator 30 for a vibration wave motor. For example, the rotor 11 formed of an annular elastic member is brought into pressure contact with the surface of the diaphragm 9. When a traveling wave is excited in the stator 30 for a vibration wave motor, each point of the surface of the diaphragm 9 on the opposite side to the piezoelectric element 20 performs a kind of elliptic motion. Thus, the rotor 11 receives a frictional force in a circumferential direction from the diaphragm 9 to be rotationally driven. The rotational direction can be reversed by switching the positive or negative sign of the phase difference of the alternating voltages to be applied to the drive phase electrodes 3 and 4.

In the vibration wave motor 40 of this embodiment, the drive phase electrodes 3 and 4 are arranged across not only the driving regions 15 and 16 but also the non-driving region 17. Therefore, there is no need to electrically connect or physically bond the power feeding member 8 to the driving regions 15 and 16. That is, in the driving regions 15 and 16, the active expansion and contraction of the piezoelectric element 20 are not inhibited by the power feeding member 8. Therefore, reduction in rotation performance of the vibration wave motor 40 due to the power feeding member 8 is prevented. Further, fluctuation in rotation performance of the vibration wave motor 40, which is caused by positional fluctuation when the power feeding member 8 is connected to the piezoelectric element 20, and reduction in quality due to fluctuation in rotational direction are prevented. Further, the power feeding member 8 is reduced in size as compared to that in the related-art vibration wave drive device, and hence the cost of the power feeding member 8 can be reduced.

Next, the driving control system of the present invention is described. The driving control system of the present invention has a feature of including at least the vibration wave motor of the present invention and a drive circuit electrically connected to the power feeding member.

FIG. 7 is a schematic diagram of a circuit of a driving control system according to one embodiment of the present invention, and is a simple control circuit diagram of the driving control system of the present invention.

Wiring A of the vibration wave motor 40 illustrated in FIG. 7 is electrically connected to the drive phase electrode 3 of the vibration wave motor 40 of the present invention through the electric wire 8a of the power feeding member 8. Similarly, wiring B is electrically connected to the drive phase electrode 4, wiring S is electrically connected to the detection phase electrode 7, and wiring G is electrically connected to the ground electrode 5 respectively through the electric wire 8a of the power feeding member 8. It is to be noted that, wiring G is grounded.

In FIG. 7, an electrical signal output from a CPU is input to the drive circuit, and the drive circuit applies alternating voltages each having a frequency that is a seventh-order natural frequency of the stator 30 for a vibration wave motor to the drive phase electrode 3 and the drive phase electrode 4 through the wiring A and the wiring B, respectively, so that the temporal phase difference therebetween becomes π/2. That is, electric power whose phase is shifted by π/2 is input to each of the driving regions 15 and 16, to thereby excite a traveling wave in the stator 30 for a vibration wave motor. At this time, the alternating voltage input to the drive phase electrode 4 through the wiring B is also simultaneously input to a phase detection circuit via a step down circuit. On the other hand, the alternating voltage output from the detection phase electrode 7 to the wiring S in accordance with the vibration of the detection region is also input to the phase detection circuit via a step down circuit. Those two alternating voltages input to the phase detection circuit are processed by a phase comparator in the phase detection circuit, and an electrical signal corresponding to the phase difference between the two alternating voltages is output to the CPU. The phase comparator of the present invention is a circuit configured to compare the phases of the two alternating voltages, and output phase information corresponding to the phase difference therebetween as an electrical signal.

Further, at the same time when the vibration wave motor 40 rotates by the traveling wave excited in the stator 30 for a vibration wave motor, an electrical signal output from an encoder for optically measuring the number of revolutions of the vibration wave motor 40 is output to the CPU. The CPU calculates, based on the preset logic, the electrical signals from the phase detection circuit and the encoder and a drive command signal (not shown), and outputs again a necessary electrical signal to the drive circuit. The driving control system of the present invention can perform such a feedback control, and can sequentially determine the electrical signal to be output to the drive circuit by the CPU, to thereby control the rotational speed and rotational direction of the vibration wave motor 40.

Next, an optical apparatus of the present invention is described. The optical apparatus of the present invention has a feature of including the driving control system according to the present invention in a drive section.

Figure 8A:
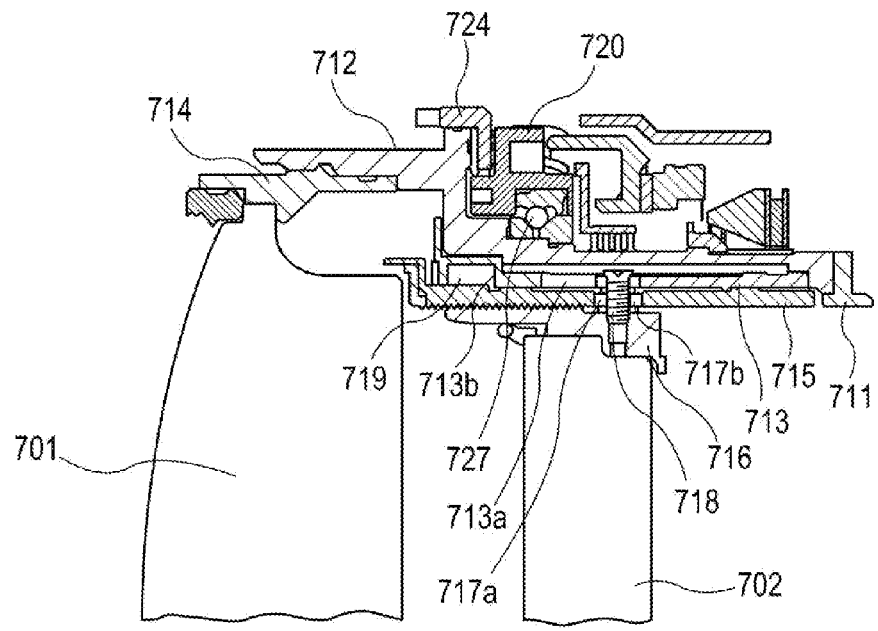
FIGS. 8A and 8B are schematic views illustrating an optical apparatus according to one embodiment of the present invention.
Figure 8B:
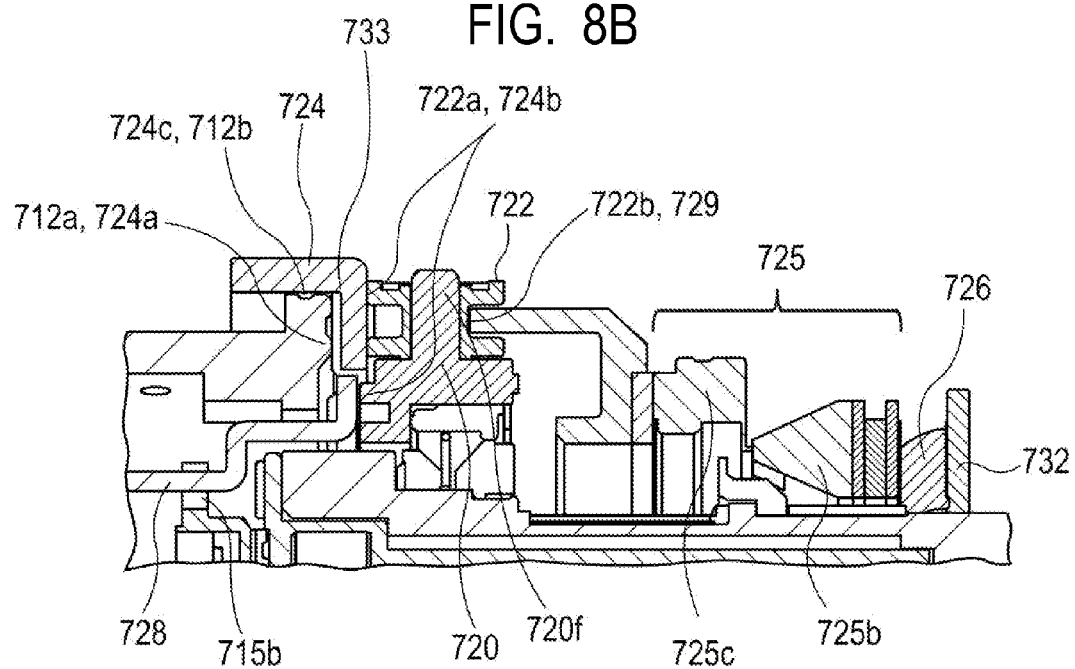
Figure 9:
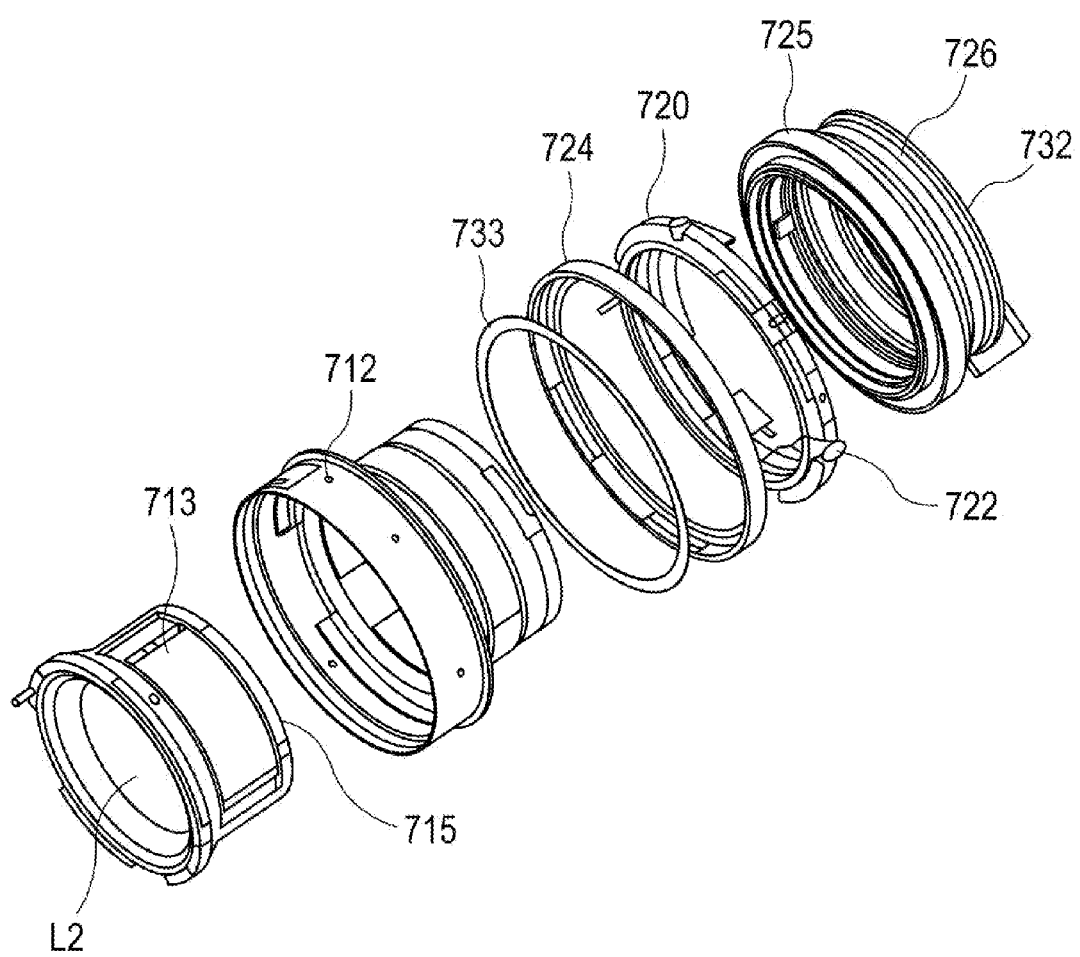
FIG. 9 is a schematic view illustrating the optical apparatus according to one embodiment of the present invention.

FIGS. 8A and 8B are main sectional views of an interchangeable lens barrel of a single-lens reflex camera, which is an exemplary embodiment of an imaging device of the present invention, serving as an optical apparatus according to one embodiment of the present invention. Further, FIG. 9 is an exploded perspective view of the interchangeable lens barrel of the single-lens reflex camera, which is the exemplary embodiment of the imaging device of the present invention, serving as the optical apparatus according to one embodiment of the present invention. A fixed barrel 712, a linear guide barrel 713, and a front lens group barrel 714 are fixed to a mount 711 mountable to and removable from a camera. Those members are fixed members of the interchangeable lens barrel.

A linear guide groove 713a extending in an optical axis direction is formed in the linear guide barrel 713 to guide a focus lens 702. Cam rollers 717a and 717b protruding in an outer radial direction are fixed with a shaft screw 718 to a rear lens group barrel 716 holding the focus lens 702. The cam roller 717a is fitted in the linear guide groove 713a.

A cam ring 715 is rotatably fitted to the inner periphery of the linear guide barrel 713. Relative movements between the linear guide barrel 713 and the cam ring 715 in the optical axis direction is restricted because a roller 719 fixed to the cam ring 715 is fitted in a circumferential groove 713b of the linear guide barrel 713. A cam groove 715a for the focus lens 702 is formed in the cam ring 715. The cam roller 717b is simultaneously fitted in the cam groove 715a.

A rotation transmitting ring 720 is arranged on the outer peripheral side of the fixed barrel 712. The rotation transmitting ring 720 is held by a ball race 727 so as to enable rotation at a certain position relative to the fixed barrel 712. A roller 722 is rotatably held with respect to the rotation transmitting ring 720 by a shaft 720f extending in a radial manner from the rotation transmitting ring 720, and a large-diameter portion 722a of the roller 722 is held in contact with a mount-side end surface 724b of a manual focus ring 724. Further, a small-diameter portion 722b of the roller 722 is held in contact with a joint member 729. Six equally spaced rollers 722 are arranged on the outer periphery of the rotation transmitting ring 720 and each roller is configured to have the above-described relationship.

A low-friction sheet (washer member) 733 is arranged on the inner diameter portion of the manual focus ring 724. The low-friction sheet 733 is interposed between a mount-side end surface 712a of the fixed barrel 712 and a front-side end surface 724a of the manual focus ring 724. Further, the outer diameter surface of the low-friction sheet 733 has a ring shape and is fitted in an inner diameter portion 724c of the manual focus ring 724. The inner diameter portion 724c of the manual focus ring 724 is further fitted in an outer diameter portion 712b of the fixed barrel 712. The low-friction sheet 733 has a function to reduce the friction in a rotary ring mechanism in which the manual focus ring 724 is rotated relative to the fixed barrel 712 about the optical axis.

It is to be noted that, the large-diameter portion 722a of the roller 722 and the mount-side end surface 724b of the manual focus ring 724 are held in contact with each other under pressure by being pressed by a wave washer 726 that presses a vibration wave motor 725 toward the front side of the lens. Similarly, the force from the wave washer 726 pressing the vibration wave motor 725 toward the front side of the lens also causes the small-diameter portion 722b of the roller 722 and the joint member 729 to be held in contact with each other under an adequate degree of pressure. The wave washer 726 is restricted from moving in the mount direction by a washer 732 bayonet-coupled to the fixed barrel 712. The spring force (urging force) generated by the wave washer 726 is transmitted to the vibration wave motor 725 and to the roller 722 and serves as a thrusting force of the manual focus ring 724 against the mount-side end surface 712a of the fixed barrel 712. That is, the manual focus ring 724 is assembled while being urged against the mount-side end surface 712a of the fixed barrel 712 via the low-friction sheet 733.

Therefore, when the vibration wave motor 725 is rotationally driven with respect to the fixed barrel 712 by the control CPU illustrated in FIG. 7, the roller 722 rotates about the center of the shaft 720f because the joint member 729 is brought into frictional contact with the small-diameter portion 722b of the roller 722. As the roller 722 rotates about the shaft 720f, the rotation transmitting ring 720 is rotated about the optical axis as a result (automatic focusing operation).

Further, when a rotational force about the optical axis is applied to the manual focus ring 724 from a manual operation input part (not shown), the roller 722 rotates about the shaft 720f due to a frictional force because the mount-side end surface 724b of the manual focus ring 724 is brought into pressure contact with the large-diameter portion 722a of the roller 722. As the large-diameter portion 722a of the roller 722 rotates about the shaft 720f, the rotation transmitting ring 720 rotates about the optical axis. At this time, the vibration wave motor 725 is prevented from rotating due to the frictional retention force of a rotor 725c and a diaphragm 725b (manual focusing operation).

Two focus keys 728 are mounted in the rotation transmitting ring 720 at positions opposite to each other and fitted in notches 715b provided at the front tip of the cam ring 715. Therefore, when the automatic focusing operation or the manual focusing operation is performed and the rotation transmitting ring 720 is rotated about the optical axis, the rotational force is transmitted to the cam ring 715 via the focus keys 728. When the cam ring is rotated about the optical axis, the rear lens group barrel 716 restricted from rotating due to the cam roller 717a and the linear guide groove 713a moves back and forth along the cam groove 715a in the cam ring 715 by the cam roller 717b. With this, the focus lens 702 is driven and the focusing operation is performed.

Although the interchangeable lens barrel of the single-lens reflex camera has been described as an example of the optical apparatus of the present invention, the present invention is applicable to an optical apparatus including the vibration wave motor in the drive section or including the driving control system regardless of the type of the camera, such as a compact camera and an electronic still camera.

Next, a method of manufacturing a stator for a vibration wave motor is described.

The manufacturing method of a vibration wave driving device of the present invention has a feature of including: a step (A) of providing a polarizing electrode on the first surface in each of the driving regions, providing a driving phase power supply electrode on the first surface in the non-driving region, and providing a common electrode on the second surface; a step (B) of applying a voltage to the polarizing electrode to subject the piezoelectric material to polarization processing; a step (C) of providing a connection electrode across the polarizing electrode and the driving phase power supply electrode; and a step (D) of electrically connecting the driving phase power supply electrode and the power feeding member to each other only in the non-driving region.

First, a method of manufacturing a piezoelectric material to be used for the piezoelectric element used in the present invention is described.

Into a raw material powder adjusted to have a desired composition, a dispersant, a binder, a plasticizer, or the like as necessary and water or an organic solvent are added, followed by mixing. The resulting mixture is pressed under a pressure necessary for forming a high-density sintered body to produce a compact. When the necessary pressure cannot be obtained only by pressing alone, cold isostatic pressing (CIP) may be performed to apply a desired pressure. Further, without employing pressing, CIP or the like may be employed from the beginning to produce a compact ingot. Further, slurry may be coated at a predetermined thickness on a support such as a film by a doctor blade method, a die coating method, or the like, and may be dried to produce a green sheet compact.

Next, the compact is fired to produce a piezoelectric material in the sintered ceramic form. The firing conditions may be adequately selected based on the desired piezoelectric material. It is preferred that the density be as high as possible and grain growth that attains uniform size be conducted. It is to be noted that, if needed, the compact may be processed into a desired shape before firing.

FIGS. 10A, 10B, 10C, 10D, and 10E are schematic process views illustrating an example of the method of manufacturing a stator for a vibration wave motor of the present invention.

Figure 10A:
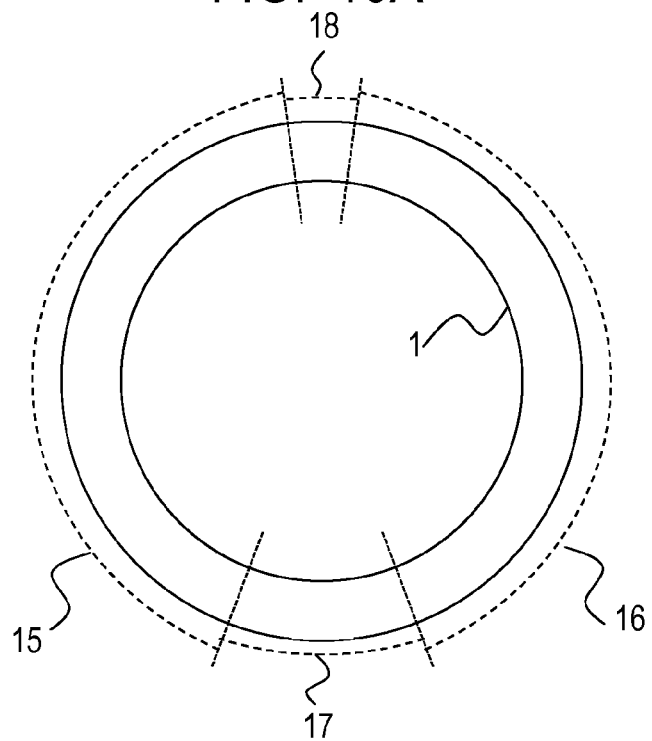
Figure 10B:
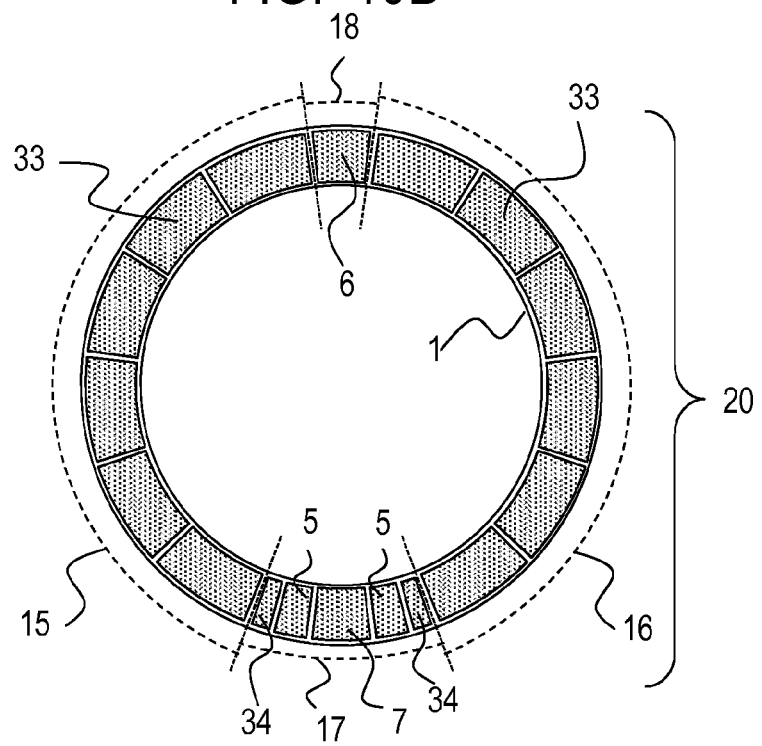
Figure 10C:
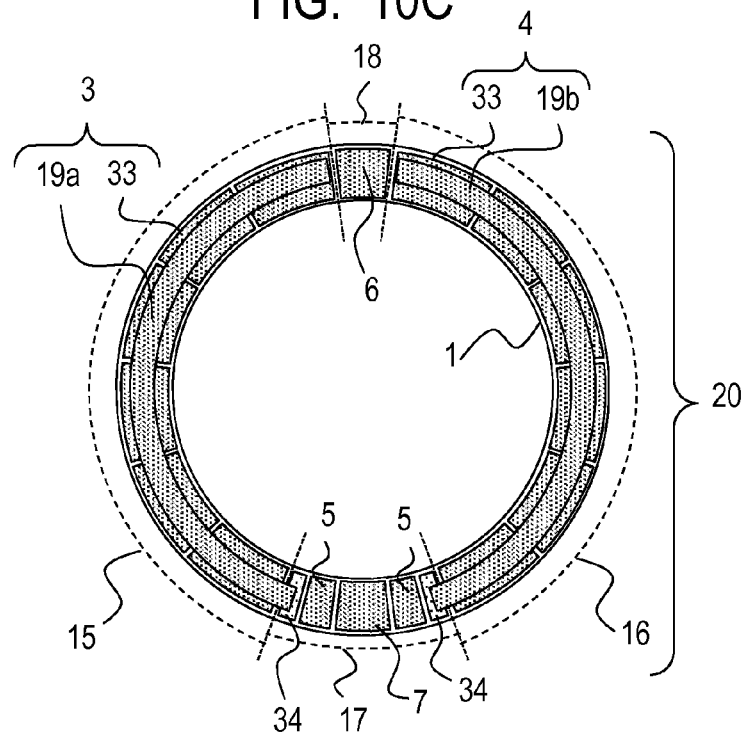
Figure 10D:
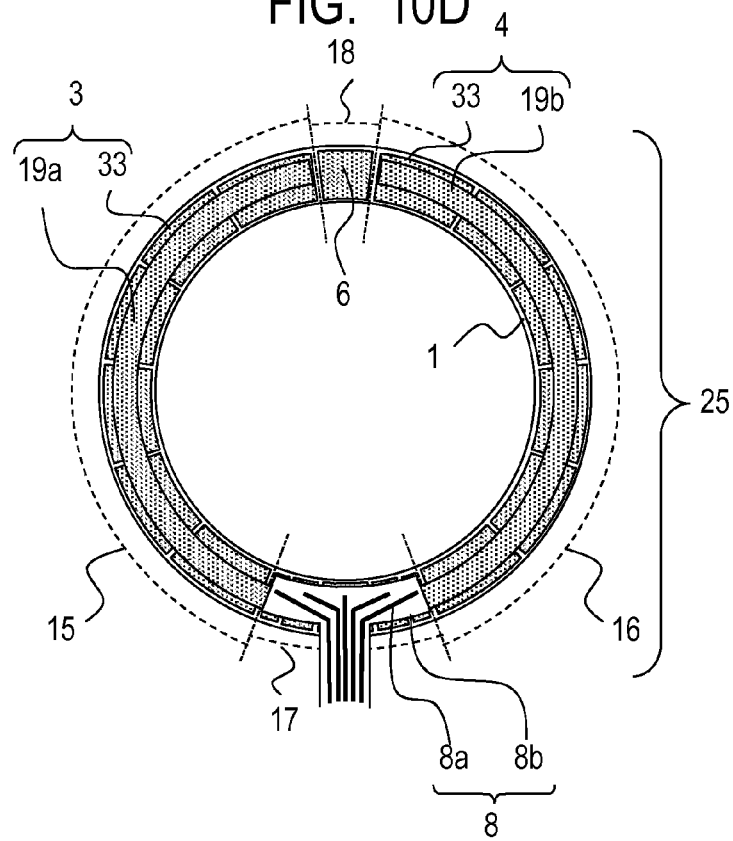

FIG. 10A is a schematic plan view of a processed piezoelectric material as viewed from one surface thereof. FIG. 10B is a schematic plan view of the piezoelectric element obtained after the polarizing electrodes, the driving phase power supply electrodes, the ground electrodes, and the detection phase electrode are produced on the one surface of the piezoelectric material. FIG. 10C is a schematic plan view of the piezoelectric element obtained after the drive phase electrodes are produced. FIG. 10D is a schematic plan view of the vibration wave drive device obtained after the power feeding member is connected. FIG. 10E is a schematic plan view of the stator for a vibration wave motor.

Now, a manufacturing method of a vibration wave driving device is described.

First, the step (A) of providing the polarizing electrode on the first surface in each of the driving regions, providing the driving phase power supply electrode on the first surface in the non-driving region, and providing the common electrode on the second surface is performed.

A sintered ceramic piezoelectric material 1 produced as described above is grinded into a desired dimension to produce the annular one-piece piezoelectric material 1 as illustrated in FIG. 10A. Then, as illustrated in FIG. 10B, the polarizing electrodes 33 and the driving phase power supply electrodes 34 are formed on one of the surfaces of the piezoelectric material 1 and the common electrode 2 is formed over the entire opposite surface of the piezoelectric material 1 by firing or drying silver paste corresponding to conductive paste, Au sputtering, Au plating, or the like, so as to obtain the piezoelectric element 20.

At this time, each of the polarizing electrodes 33 is preferred to be formed as wide as possible with respect to the surface of the piezoelectric material from the viewpoint of efficiency of exciting vibration. It is to be noted that, the distance between the electrodes is preferred to be as small as possible within a range that can prevent discharge between electrodes during polarization. The thickness of the electrode is preferred to be as thin as possible so that the resistance value of the electrode is less than 1Ω.

Next, the step (B) of applying a voltage to the polarizing electrode to subject the piezoelectric material to polarization processing is performed. The polarization processing is performed so that the piezoelectric element 20 achieves the polarity of expansion and contraction illustrated in FIG. 4A. When polarization processing is performed by applying certain electric fields in reversed electric field directions for every adjacent electrode, the polarity of expansion and contraction with respect to the electric field in the same direction is reversed alternately every λ/2 pitch. The polarization processing temperature is preferred to be equal to or lower than the Curie temperature Tc or the depolarization temperature Td. It is to be noted that, even when the polarization processing temperature is equal to or higher than the Curie temperature Tc or the depolarization temperature Td, it is sufficient to apply the electric field until the temperature is sufficiently lower than the Curie temperature Tc or the depolarization temperature Td. The processing time is preferred to be from 5 minutes to 10 hours. The processing atmosphere is preferred to be air or a non-combustible oil such as silicone oil. An electric field of from 0.5 kV/mm to 5.0 kV/mm is applied as the processing voltage.

As the manufacturing method according to one exemplary embodiment of the present invention, it is preferred that, as illustrated in FIG. 4B, also the non-driving regions 17 and 18 be subjected to polarization processing so as to have the polarity of expansion and contraction in part. However, the entire non-driving regions 17 and 18 may not be subjected to polarization processing, and in contrast, the driving phase power supply electrodes 34 may be subjected to polarization processing. Further, it is preferred that polarization processing be performed prior to the bonding of the diaphragm 9, but the polarization processing may be performed after the bonding.

Next, the step (C) of providing the connection electrode across the polarizing electrode and the driving phase power supply electrode is performed.

With respect to the piezoelectric element 20 subjected to polarization processing, as illustrated in FIG. 10C, the connection electrodes 19a and 19b are provided by firing or drying silver paste corresponding to conductive paste, Au sputtering, Au plating, or the like. The polarizing electrodes 33 and the driving phase power supply electrodes 34 are connected to each other to produce the drive phase electrodes 3 and 4. The connection electrodes 19a and 19b are preferred to be made of the same material as the polarizing electrodes 33 and the driving phase power supply electrodes 34, but may be different therefrom. Further, the production method may be different while using the same material, such that the polarizing electrodes 33 and the driving phase power supply electrodes 34 are produced by firing silver paste, while the connection electrodes are formed by drying silver paste. The connection electrodes 19a and 19b may each be a single electrode as illustrated in FIG. 10C, or may each be multiple electrodes that separately connect the adjacent polarizing electrodes 33 to each other, or the adjacent polarizing electrode 33 and driving phase power supply electrode 34 to each other. The thickness of the connection electrodes 19a and 19b is preferred to be as thin as possible so that the resistance value of the electrode is less than 1Ω. Further, the step of providing the connection electrodes 19a and 19 and connecting the polarizing electrodes 33 and the driving phase power supply electrodes 34 to each other, to thereby produce the drive phase electrodes 3 and 4 may be performed prior to or after the bonding of the diaphragm 9.

Next, the step (D) of electrically connecting the driving phase power supply electrode and the power feeding member to each other only in the non-driving region is performed.

As illustrated in FIG. 10D, the power feeding member 8 is connected to the piezoelectric element 20. As the power feeding member 8, it is preferred to use the flexible printed board 8 that has high dimensional accuracy and can be easily positioned with use of a jig or the like. The flexible printed board 8 may be connected with use of an epoxy adhesive or the like, but it is preferred that conductive anisotropic conductive paste (ACP) or anisotropic conductive film (ACF) be thermocompression-bonded so as to reduce failure in electrical connection and in terms of mass production. Further, the step of connecting the power feeding member 8 may be performed prior to or after the bonding of the diaphragm 9.

Meanwhile, the detection region requires the polarity of expansion and contraction, but when the thermocompression bonding is performed at a temperature equal to or higher than the Curie temperature (Tc) or the depolarization temperature (Td) of the piezoelectric material, the piezoelectric constant of the detection region markedly reduces. However, the alternating voltage output from the detection phase electrode 7 is not necessarily large. When the alternating voltage output from the detection phase electrode 7 is small, the configuration of the step down circuit illustrated in FIG. 7 (step down circuit connected to wiring S in FIG. 7) can be simpler, or the step down circuit can be omitted. However, at least a piezoelectric constant equal to or more than a range that enables the phase comparator in FIG. 7 to detect a signal is required.

Meanwhile, even if the absolute value of the piezoelectric constant of the detection region is 0, the detection region may be subjected to repolarization processing to cause the detection region to have the polarity of expansion and contraction. The conditions of the repolarization processing may be smaller in electric field, temperature, and time than the polarization conditions. It is only required that the polarity of expansion and contraction be caused in the piezoelectric material 1 of the detection region, and the signal be detected by the phase comparator in FIG. 7. The step of performing the repolarization processing after the connection of the power feeding member through thermocompression bonding may be performed prior to or after the bonding of the diaphragm 9.

Next, the method of manufacturing a stator for a vibration wave motor is described.

After the diaphragm 9 is bonded to the vibration wave drive device 25 produced as described above, as illustrated in FIG. 10E, the ground electrodes 5 and 6 and the diaphragm 9 are electrically short-circuited by the short-circuiting wire 10. As the short-circuiting wire 10, dried silver paste corresponding to conductive paste can be used. The drying temperature is preferred to be less than the Curie temperature Tc or the depolarization temperature Td of the piezoelectric material 1. When the drying temperature is equal to or higher than Tc or Td of the piezoelectric material 1, there is a possibility that the absolute value d(1) of the piezoelectric constant of the driving regions may be reduced.

Through the series of manufacturing steps as described above, the stator 30 for a vibration wave motor of the present invention is obtained. Next, as the rotor 11, an annular elastic member having an inner diameter and an outer diameter similar to those of the stator 30 for a vibration wave motor is brought into pressure contact with the stator 30 for a vibration wave motor, to thereby obtain the vibration wave motor 40. Finally, a drive control circuit including the phase comparator is connected to the power feeding member 8, to thereby produce the driving control system for the vibration wave motor.

The exemplary method of manufacturing each of the vibration wave drive device, the stator for a vibration wave motor, the vibration wave motor, and the driving control system of the present invention has been described above, but each of the vibration wave drive device, the stator for a vibration wave motor, the vibration wave motor, and the driving control system of the present invention may be manufactured by a method different from the above description as long as the optical apparatus is embodied. For example, the driving phase power supply electrodes 34 may be subjected to polarization processing in advance, and the piezoelectric constant (absolute value d(2) of the piezoelectric constant) of the parts of the non-driving region 17 of the piezoelectric element 20 in which the drive phase electrodes 3 and 4 are arranged may be reduced by the thermocompression bonding temperature for connection of the flexible printed board 8. Further, without forming the driving phase power supply electrodes 34, when connecting the polarizing electrodes 33, the connection electrodes 19a and 19b may be extended up to the non-driving region 17 to produce the drive phase electrodes 3 and 4.

EXAMPLES

Next, the vibration wave motor and a vibration wave motor control system of the present invention are specifically described by means of examples, but the present invention is not limited to the following examples. It is to be noted that, the examples are described with reference to the drawings with use of the reference symbols in the drawings.

Example 1

As the piezoelectric material 1, commercially available lead zirconate titanate (PZT) was used to produce the annular piezoelectric material 1 illustrated in FIG. 10A. The Curie temperature of lead zirconate titanate (PZT) is 310° C.

Next, through screen printing of silver paste, the common electrode 2 was formed on one surface of the annular piezoelectric material 1 as illustrated in FIG. 3C, while the polarizing electrodes 33, the driving phase power supply electrodes 34, the ground electrodes 5 and 6, and the detection phase electrode 7 were formed on the other surface of the annular piezoelectric material 1 as illustrated in FIG. 10B.

At this time, the inter-electrode distance of adjacent electrodes illustrated in FIG. 10B was set to 0.5 mm.

Next, between the common electrode 2 and the polarizing electrodes 33, the ground electrodes 5 and 6, and the detection phase electrode 7, polarization processing was performed in air with use of a DC power supply so that the polarity of expansion and contraction of the piezoelectric element became as illustrated in FIG. 4B. The magnitude of the voltage was set so that an electric field of 0.6 kV/mm was applied, and the temperature and the voltage application time period were set to 220° C. and 30 minutes, respectively.

Next, as illustrated in FIG. 10C, in order to connect the polarizing electrodes 33 and the driving phase power supply electrodes 34 to each other, the connection electrodes 19a and 19b were formed of silver paste to obtain the piezoelectric element 20. The silver paste was dried at a temperature that was sufficiently lower than the Curie temperature of the piezoelectric material 1. Then, the resistance value of the drive phase electrode 3 was measured by a multimeter (electric tester). One end of the tester was brought into contact with the driving phase power supply electrode 34, and the other end thereof was brought into contact with the polarizing electrode 33 of the drive phase electrode 3, which was most separated from the driving phase power supply electrode 34 in the annular circumferential direction. As a result, the resistance value of the electrode was 0.6Ω.

Next, as illustrated in FIG. 10D, the flexible printed board 8 was thermocompression-bonded to the piezoelectric element 20 with use of an anisotropic conductive film (ACF) at 180° C., to thereby produce the vibration wave drive device 25. A region to which the flexible printed board 8 was thermocompression-bonded and a region in which the flexible printed board 8 was physically bonded to the piezoelectric element 20 were within the range of the non-driving region 17. Further, a region in which the electric wire 8a in the flexible printed board 8 was electrically connected to the drive phase electrodes 3 and 4, the two ground electrodes 5, and the detection phase electrode 7 was also within the range of the non-driving region 17.

Next, as illustrated in FIG. 10E, the vibration wave drive device 25 was thermocompression-bonded to the diaphragm 9 made of SUS, and the diaphragm 9 and all of the ground electrodes 5 and 6 were connected with use of the short-circuiting wire 10 made of silver paste, to thereby produce the stator 30 for a vibration wave motor. The thermocompression bonding of the diaphragm and the drying of the silver paste were performed at a temperature that was sufficiently lower than the Curie temperature of the piezoelectric material 1.

The rotor 11 was brought into pressure contact with the stator 30 for a vibration wave motor produced as described above, to thereby produce the vibration wave motor 40 of Example 1. Further, the flexible printed board 8 was connected to the drive control circuit, to thereby produce the vibration wave motor control system of Example 1.

Example 2

As the piezoelectric material 1, similarly to Example 1, lead zirconate titanate (PZT) was used to produce the annular piezoelectric material 1.

Next, through screen printing of silver paste, the common electrode 2 was formed on one surface of the annular piezoelectric material 1, while the polarizing electrodes 33, the ground electrodes 5 and 6, and the detection phase electrode 7 were formed on the other surface of the annular piezoelectric material 1. The driving phase power supply electrodes 34 provided in Example 1 were not provided.

Next, similarly to Example 1, between the common electrode 2 and the polarizing electrodes 33, the ground electrodes 5 and 6, and the detection phase electrode 7, polarization processing was performed in air with use of a DC power supply so that the polarity of expansion and contraction of the piezoelectric element became as illustrated in FIG. 4B.

Next, in order to connect the polarizing electrodes 33, the connection electrodes 19a and 19b were formed of silver paste to obtain the piezoelectric element 20. The connection electrodes 19a and 19b for connecting the polarizing electrodes 33 were provided so as to extend up to the non-driving region 17 so that the distance to the ground electrode 5 was about 1.0 mm, and were combined with the polarizing electrodes 33 to obtain the drive phase electrodes 3 and 4. Then, the resistance value of the drive phase electrode 3 was measured by a multimeter (electric tester). One end of the tester was brought into contact with a region of the connection electrode 19a in the non-driving region 17, and the other end thereof was brought into contact with the polarizing electrode 33 of the drive phase electrode 3, which was most separated from the region of the connection electrode 19a in the non-driving region 17 in the annular circumferential direction. As a result, the resistance value of the electrode was 0.5Ω.

Next, similarly to Example 1, the flexible printed board 8 was thermocompression-bonded to the piezoelectric element 20, to thereby produce the vibration wave drive device 25. The thermocompression bonding was performed with use of anisotropic conductive paste (ACP) at 160° C. A region to which the flexible printed board 8 was thermocompression-bonded and a region in which the flexible printed board 8 was physically bonded to the piezoelectric element 20 were within the range of the non-driving region 17. Further, a region in which the electric wire 8a in the flexible printed board 8 was electrically connected to the drive phase electrodes 3 and 4, the two ground electrodes 5, and the detection phase electrode 7 was also within the range of the non-driving region 17.

Next, similarly to Example 1, the vibration wave drive device 25 was thermocompression-bonded to the diaphragm 9 made of SUS, and the diaphragm 9 and all of the ground electrodes 5 and 6 were connected with the short-circuiting wire 10 made of silver paste, to thereby produce the stator 30 for a vibration wave motor. The thermocompression bonding of the diaphragm and the drying of the silver paste were performed at a temperature that was sufficiently lower than the Curie temperature of the piezoelectric material 1.

The rotor 11 was brought into pressure contact with the stator 30 for a vibration wave motor produced as described above, to thereby produce the vibration wave motor 40 of Example 2. Further, the flexible printed board 8 was connected to the drive control circuit, to thereby produce the vibration wave motor control system of Example 2.

Example 3

As the piezoelectric material 1, the following materials were used to produce the annular piezoelectric material 1.

First, as a raw material, barium titanate having an average particle diameter of 100 nm (manufactured by SAKAI CHEMICAL INDUSTRY CO., LTD.: BT-01 (product name)), calcium titanate having an average particle diameter of 300 nm (manufactured by SAKAI CHEMICAL INDUSTRY CO., LTD.: CT-03 (product name)), and calcium zirconate having an average particle diameter of 300 nm (manufactured by SAKAI CHEMICAL INDUSTRY CO., LTD.: CZ-03 (product name)) were weighed at a molar ratio of 81.3:12.7:6.0.

Next, those weighed powders were dry-mixed for 24 hours with use of a ball mill. In order to granulate the obtained mixed powder, 0.26 parts by weight of manganese (II) acetate on a manganese metal basis with respect to the mixed powder and 3 parts by weight of a PVA binder with respect to the mixed powder were caused to adhere to surfaces of the mixed powder with use of a spray dryer apparatus.

Next, the obtained granulated powder was filled in a mold, and pressed under a molding pressure of 200 MPa with use of a pressing machine to produce a disk-shaped compact. This compact may be further pressurized with use of a cold isostatic pressing machine.

The obtained compact was put into an electric furnace and kept for 5 hours at the maximum temperature of 1,380° C. Thus, the compact was sintered in the atmosphere for 24 hours in total.

Next, the sintered piezoelectric material 1 was ground into an annular shape. Through screen printing of silver paste, the common electrode 2 was formed on one surface of the obtained annular piezoelectric material 1 as illustrated in FIG. 3C, while the polarizing electrodes 33, the driving phase power supply electrodes 34, the ground electrodes 5 and 6, and the detection phase electrode 7 were formed on the other surface thereof as illustrated in FIG. 10B. At this time, the inter-electrode distance of adjacent electrodes illustrated in FIG. 10B was set to 0.5 mm.

Next, between the common electrode 2 and the polarizing electrodes 33, the ground electrodes 5 and 6, and the detection phase electrode 7, polarization processing was performed in air with use of a DC power supply so that the polarity of expansion and contraction of the piezoelectric element became as illustrated in FIG. 4B. The magnitude of the voltage was set so that an electric field of 1.0 kV/mm was applied, and the temperature and the voltage application time period were set to 100° C. and 180 minutes, respectively. Further, the voltage was applied until the temperature was reduced to 50° C.

Next, as illustrated in FIG. 10C, in order to connect the polarizing electrodes 33 and the driving phase power supply electrodes 34 to each other, the connection electrodes 19a and 19b were formed of silver paste to obtain the piezoelectric element 20. The silver paste was dried at a temperature that was sufficiently lower than the Curie temperature of the piezoelectric material 1. Then, the resistance value of the drive phase electrode 3 was measured by a multimeter (electric tester). One end of the tester was brought into contact with the driving phase power supply electrode 34, and the other end thereof was brought into contact with the polarizing electrode 33 of the drive phase electrode 3, which was most separated from the driving phase power supply electrode 34 in the annular circumferential direction. As a result, the resistance value of the electrode was 0.6Ω.

Next, as illustrated in FIG. 10D, the flexible printed board 8 was thermocompression-bonded to the piezoelectric element 20 with use of an anisotropic conductive film (ACF) at 180° C., to thereby produce the vibration wave drive device 25. A region to which the flexible printed board 8 was thermocompression-bonded and a region in which the flexible printed board 8 was physically bonded to the piezoelectric element 20 were within the range of the non-driving region 17. Further, a region in which the electric wire 8a in the flexible printed board 8 was electrically connected to the drive phase electrodes 3 and 4, the two ground electrodes 5, and the detection phase electrode 7 was also within the range of the non-driving region 17.

Next, through the electric wire 8a of the flexible printed board 8 (center wire of the five wires of the electric wire 8a illustrated in FIG. 10D), only the detection phase electrode 7 was subjected to repolarization processing. The magnitude of the voltage for the repolarization processing was set so that an electric field of 0.5 kV/mm was applied, and the temperature and the voltage application time period were set to room temperature and 10 minutes, respectively. The voltage was applied so that the polarity of expansion and contraction became "–".

Next, as illustrated in FIG. 10E, the vibration wave drive device 25 was thermocompression-bonded to the diaphragm 9 made of SUS, and the diaphragm 9 and all of the ground electrodes 5 and 6 were connected with use of the short-circuiting wire 10 made of silver paste, to thereby produce the stator 30 for a vibration wave motor. The thermocompression bonding of the diaphragm and the drying of the silver paste were performed at a temperature that was sufficiently lower than the Curie temperature of the piezoelectric material 1.

The rotor 11 was brought into pressure contact with the stator 30 for a vibration wave motor produced as described above, to thereby produce the vibration wave motor 40 of Example 3. Further, the flexible printed board 8 was connected to the drive control circuit, to thereby produce the vibration wave motor control system of Example 3.

Example 4

The vibration wave motor 40 of Example 4 was produced by a method similar to Example 3 with the exception that the flexible printed board 8 was thermocompression-bonded to the piezoelectric element 20 with use of anisotropic conductive paste (ACP) so that the temperature of the detection region was not increased to be equal to or more than 105° C., and the repolarization processing was not performed. Further, the flexible printed board 8 was connected to the drive control circuit, to thereby produce the vibration wave motor control system of Example 4.

Example 5

The piezoelectric material 1 was formed from raw materials of $K_2CO_3$, $Na_2CO_3$, $Nb_2O_5$, and $Ta_2O_5$ that were mixed so that a perovskite-type sintered compact $(K,Na)(Nb,Ta)O_3$ having a desired composition ratio was obtained. The other steps were similar to those in Example 3. With this method, the vibration wave motor 40 of Example 5 was manufactured, and further the flexible printed board 8 was connected to the drive control circuit to produce the vibration wave motor control system of the Example 5. It is to be noted that, the firing condition was set to 3 hours at 1,300° C. in an air atmosphere. The polarization processing was performed in air. The magnitude of the voltage was set so that an electric field of 4.0 kV/mm was applied, and the temperature and the voltage application time period were set to 150° C. and 300 minutes, respectively. The magnitude of the voltage for the repolarization processing was set so that an electric field of 0.5 kV/mm was applied, and the temperature and the voltage application time period were set to 60° C. and 10 minutes, respectively. The voltage was applied so that the polarity of expansion and contraction became "−".

Example 6

As the piezoelectric material 1, the annular piezoelectric material 1 similar to Example 3 was produced.

Next, through screen printing of silver paste, the common electrode 2 was formed on one surface of the annular piezoelectric material 1 as illustrated in FIG. 3C, while the polarizing electrodes 33, the driving phase power supply electrodes 34, the ground electrodes 5 and 6, and the detection phase electrode 7 were formed on the other surface of the annular piezoelectric material 1 as illustrated in FIG. 10B.

At this time, the inter-electrode distance of adjacent electrodes illustrated in FIG. 10B was set to 0.5 mm.

Next, between the common electrode 2 and the polarizing electrodes 33, the ground electrodes 5 and 6, and the detection phase electrode 7, polarization processing was performed in air with use of a DC power supply so that the polarity of expansion and contraction of the piezoelectric element became as illustrated in FIG. 4B. At this time, the part between the common electrode 2 and the driving phase power supply electrode 34 was polarized at the same time. The polarity of expansion and contraction was set to "+" similarly to the ground electrode 5. The magnitude of the voltage was set so that an electric field of 1.0 kV/mm was applied, and the temperature and the voltage application time period were set to 100° C. and 180 minutes, respectively. Further, the voltage was applied until the temperature was reduced to 50° C.

Next, as illustrated in FIG. 10C, in order to connect the polarizing electrodes 33 and the driving phase power supply electrodes 34 to each other, the connection electrodes 19*a* and 19*b* were formed of silver paste to obtain the piezoelectric element 20. The silver paste was dried at a temperature that was sufficiently lower than the Curie temperature of the piezoelectric material 1. Then, the resistance value of the drive phase electrode 3 was measured by a multimeter (electric tester). One end of the tester was brought into contact with the driving phase power supply electrode 34, and the other end thereof was brought into contact with the polarizing electrode 33 of the drive phase electrode 3, which was most separated from the driving phase power supply electrode 34 in the annular circumferential direction. As a result, the resistance value of the electrode was 0.6Ω.

Next, as illustrated in FIG. 10D, the flexible printed board 8 was thermocompression-bonded to the piezoelectric element 20 with use of anisotropic conductive paste (ACP) so that the temperature of the non-driving region was not increased to be equal to or more than 105° C., to thereby produce the vibration wave drive device 25. A region to which the flexible printed board 8 was thermocompression-bonded and a region in which the flexible printed board 8 was physically bonded to the piezoelectric element 20 were within the range of the non-driving region 17. Further, a region in which the electric wire 8*a* in the flexible printed board 8 was electrically connected to the drive phase electrodes 3 and 4, the two ground electrodes 5, and the detection phase electrode 7 was also within the range of the non-driving region 17.

Next, as illustrated in FIG. 10E, the vibration wave drive device 25 was thermocompression-bonded to the diaphragm 9 made of SUS, and the diaphragm 9 and all of the ground electrodes 5 and 6 were connected with use of the short-circuiting wire 10 made of silver paste, to thereby produce the stator 30 for a vibration wave motor. The thermocompression bonding of the diaphragm and the drying of the silver paste were performed at a temperature that was sufficiently lower than the Curie temperature of the piezoelectric material 1.

The rotor 11 was brought into pressure contact with the stator 30 for a vibration wave motor produced as described above, to thereby produce the vibration wave motor 40 of Example 6. Further, the flexible printed board 8 was connected to the drive control circuit, to thereby produce the vibration wave motor control system of Example 6.

Comparative Example 1

FIGS. 11A, 11B, 11C, 11D, and 11E are schematic process views illustrating an example of a method of manufacturing a stator for a vibration wave motor according to Comparative Example 1.

Figure 11A:
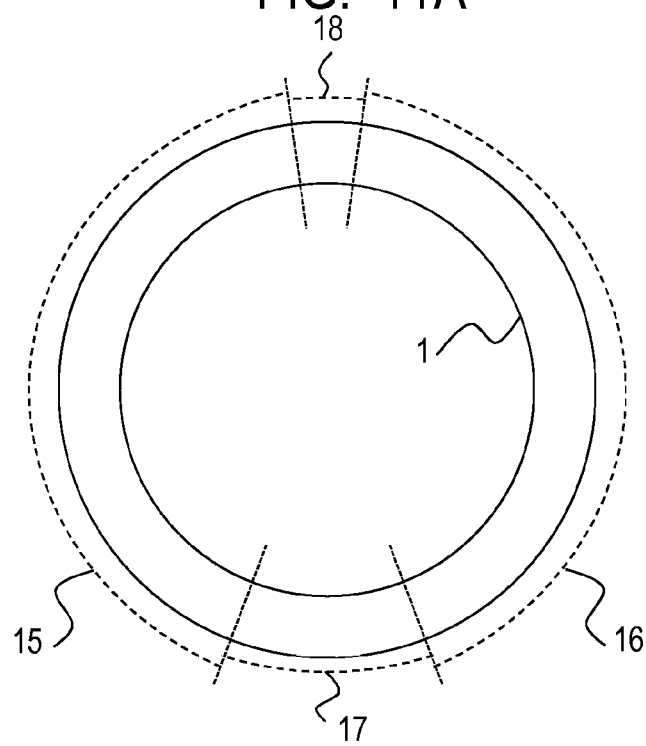
FIGS. 11A, 11B, 11C, 11D, and 11E are schematic process views illustrating an example of a method of manufacturing a stator for a vibration wave motor according to Comparative Example 1.
Figure 11B:
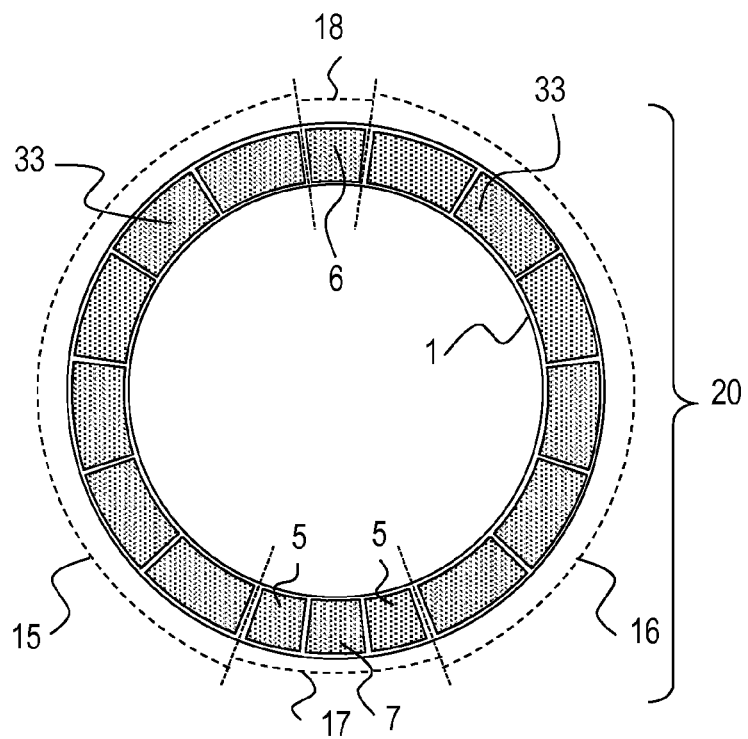
Figure 11C:
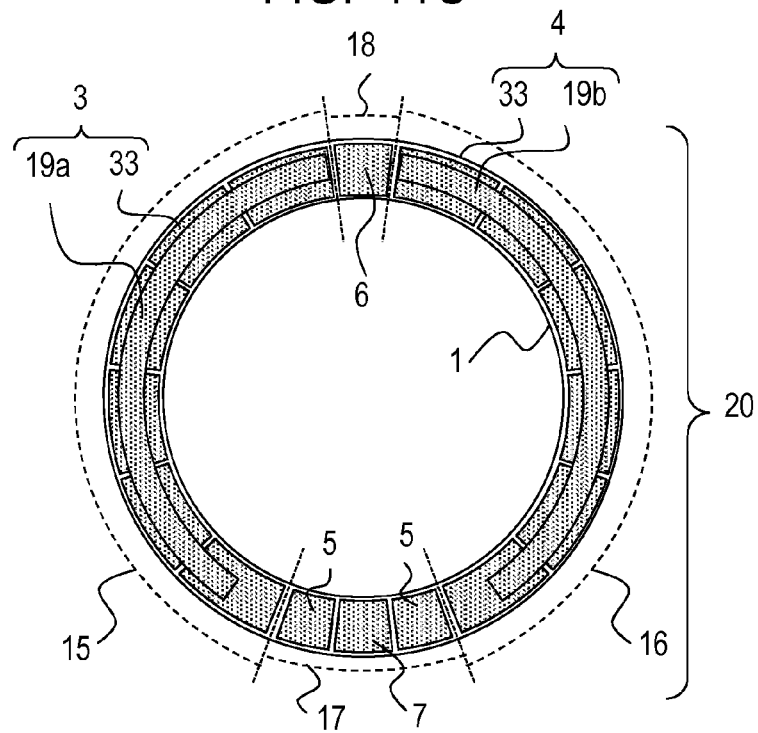
Figure 11D:
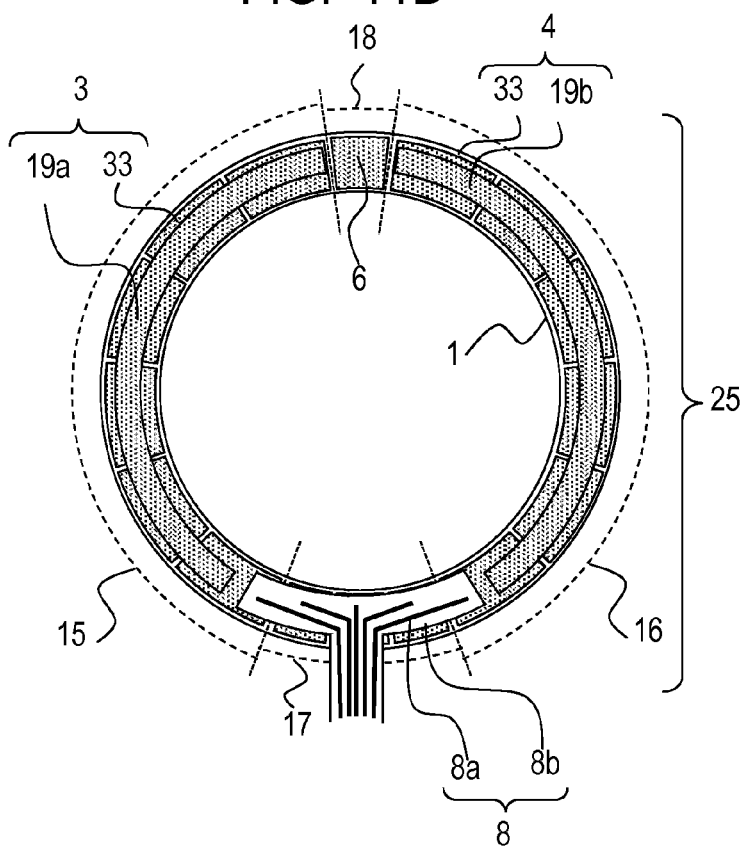
Figure 11E:
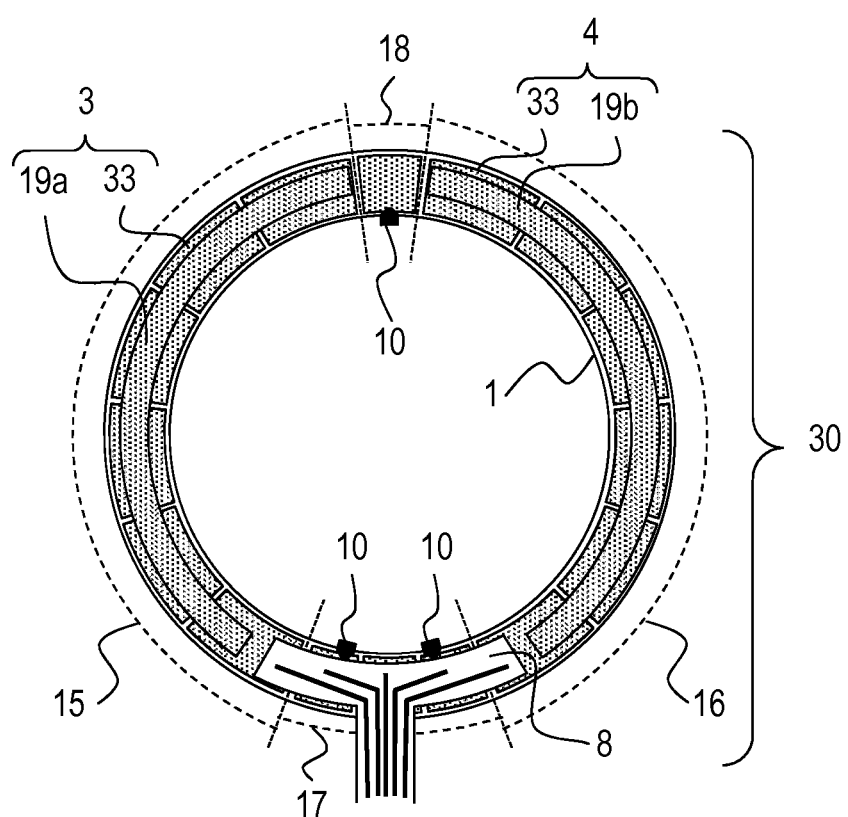

FIG. 11A is a schematic plan view of a processed piezoelectric material as viewed from one surface thereof. FIG. 11B is a schematic plan view of the piezoelectric element obtained after the polarizing electrodes, the ground electrodes, and the detection phase electrode are produced on the one surface of the piezoelectric material. FIG. 11C is a schematic plan view of the piezoelectric element after the drive phase electrodes are produced. FIG. 11D is a schematic plan view of the vibration wave drive device after the power feeding member is connected. FIG. 11E is a schematic plan view of the stator for a vibration wave motor.

As the piezoelectric material 1, similarly to Example 1, commercially available lead zirconate titanate (PZT) was used to produce the annular piezoelectric material 1 illustrated in FIG. 11A. The Curie temperature of lead zirconate titanate (PZT) is 310° C.

Next, through screen printing of silver paste, the common electrode 2 was formed on one surface of the annular piezoelectric material 1 as illustrated in FIG. 3C, while the polarizing electrodes 33, the ground electrodes 5 and 6, and the detection phase electrode 7 were formed on the other surface of the annular piezoelectric material 1 as illustrated in FIG. 11B.

At this time, the inter-electrode distance of adjacent electrodes illustrated in FIG. 11B was set to 0.5 mm.

Next, between the common electrode 2 and the polarizing electrodes 33, the ground electrodes 5 and 6, and the detection phase electrode 7, polarization processing was performed in air with use of a DC power supply so that the polarity of expansion and contraction of the piezoelectric element became as illustrated in FIG. 4B. The magnitude of the voltage was set so that an electric field of 0.6 kV/mm was applied, and the temperature and the voltage application time period were set to 220° C. and 30 minutes, respectively.

Next, as illustrated in FIG. 11C, in order to connect the polarizing electrodes 33 to each other, the connection electrodes 19a and 19b were formed of silver paste to obtain the piezoelectric element 20. The silver paste was dried at a temperature that was sufficiently lower than the Curie temperature of the piezoelectric material 1.

Next, as illustrated in FIG. 11D, the flexible printed board 8 was thermocompression-bonded to the piezoelectric element 20 with use of an anisotropic conductive film (ACF) at 180° C., to thereby produce the vibration wave drive device 25. A region to which the flexible printed board 8 was thermocompression-bonded and a region in which the flexible printed board 8 was physically bonded to the piezoelectric element 20 were in the range of the non-driving region 17 and parts of the driving regions 15 and 16, and the average annular length was λ/8. Further, a region in which the electric wire 8a in the flexible printed board 8 was electrically connected to the drive phase electrodes 3 and 4, the two ground electrodes 5, and the detection phase electrode 7 was also in the range of the non-driving region 17 and parts of the driving regions 15 and 16.

Next, as illustrated in FIG. 11E, the vibration wave drive device 25 was thermocompression-bonded to the diaphragm 9 made of SUS, and the diaphragm 9 and all of the ground electrodes 5 and 6 were connected with use of the short-circuiting wire 10 made of silver paste, to thereby produce the stator 30 for a vibration wave motor. The thermocompression bonding of the diaphragm and the drying of the silver paste were performed at a temperature that was sufficiently lower than the Curie temperature of the piezoelectric material 1.

The rotor 11 was brought into pressure contact with the stator 30 for a vibration wave motor produced as described above, to thereby produce the vibration wave motor 40 of Comparative Example 1. Further, the flexible printed board 8 was connected to the drive control circuit, to thereby produce the vibration wave motor control system of Comparative Example 1.

Comparative Example 2

As the piezoelectric material 1, similarly to Example 1, lead zirconate titanate (PZT) was used to produce the annular piezoelectric material 1.

Next, through screen printing of silver paste, the common electrode 2 was formed on one surface of the annular piezoelectric material 1 as illustrated in FIG. 3C, while the polarizing electrodes 33, the driving phase power supply electrodes 34, the ground electrodes 5 and 6, and the detection phase electrode 7 were formed on the other surface of the annular piezoelectric material 1 as illustrated in FIG. 10B.

At this time, the inter-electrode distance of adjacent electrodes illustrated in FIG. 10B was set to 0.5 mm.

Next, between the common electrode 2 and the polarizing electrodes 33, the ground electrodes 5 and 6, and the detection phase electrode 7, polarization processing was performed in air with use of a DC power supply so that the polarity of expansion and contraction of the piezoelectric element became as illustrated in FIG. 4B. At this time, the part between the common electrode 2 and the driving phase power supply electrode 34 was polarized at the same time. The polarity of expansion and contraction was set to "+" similarly to the ground electrode 5. The magnitude of the voltage was set so that an electric field of 0.6 kV/mm was applied, and the temperature and the voltage application time period were set to 220° C. and 30 minutes, respectively.

Next, as illustrated in FIG. 10C, in order to connect the polarizing electrodes 33 and the driving phase power supply electrodes 34 to each other, the connection electrodes 19a and 19b were formed of silver paste to obtain the piezoelectric element 20. The silver paste was dried at a temperature that was sufficiently lower than the Curie temperature of the piezoelectric material 1. Then, the resistance value of the drive phase electrode 3 was measured by a multimeter (electric tester). One end of the tester was brought into contact with the driving phase power supply electrode 34, and the other end thereof was brought into contact with the polarizing electrode 33 of the drive phase electrode 3, which was most separated from the driving phase power supply electrode 34 in the annular circumferential direction. As a result, the resistance value of the electrode was 0.6Ω.

Next, as illustrated in FIG. 10D, the flexible printed board 8 was thermocompression-bonded to the piezoelectric element 20 with use of an anisotropic conductive film (ACF) at 180° C., to thereby produce the vibration wave drive device 25. A region to which the flexible printed board 8 was thermocompression-bonded and a region in which the flexible printed board 8 was physically bonded to the piezoelectric element 20 were both within the range of the non-driving region 17. Further, a region in which the electric wire 8a in the flexible printed board 8 was electrically connected to the drive phase electrodes 3 and 4, the two ground electrodes 5, and the detection phase electrode 7 was also within the range of the non-driving region 17.

Next, as illustrated in FIG. 10E, the vibration wave drive device 25 was thermocompression-bonded to the diaphragm 9 made of SUS, and the diaphragm 9 and all of the ground electrodes 5 and 6 were connected with use of the short-circuiting wire 10 made of silver paste, to thereby produce the stator 30 for a oscillatory wave motor. The thermocompression bonding of the diaphragm and the drying of the silver paste were performed at a temperature that was sufficiently lower than the Curie temperature of the piezoelectric material 1.

The rotor 11 was brought into pressure contact with the stator 30 for a vibration wave motor produced as described above, to thereby produce the vibration wave motor 40 of Comparative Example 2. Further, the flexible printed board 8 was connected to the drive control circuit, to thereby produce the vibration wave motor control system of Comparative Example 2.

With use of the vibration wave motor control system of each of Examples and Comparative Examples produced as described above, the maximum number of right and left revolutions of the vibration wave motor while the frequency of the alternating voltage was swept was evaluated under the following conditions. The load of the rotor was 150 g·cm, and an alternating voltage of 60 V was input. Table 1 below shows the results of Examples and Comparative Examples.

Further, one of the annular piezoelectric elements 20 of Examples and Comparative Examples was taken for reference, and a cuboid having an aspect ratio corresponding to the length of λ/4 and the width of the polarizing electrode width was cut from the part of the driving region 15 in which the polarizing electrode 33 located in the vicinity of the center portion was arranged. The change in dielectric constant of the cuboid piezoelectric material was measured while increasing the temperature in a thermostatic chamber, to thereby measure the temperature Tc at which the dielectric constant was maximum. Further, another cuboid piezoelectric material that was similarly cut was maintained heated for 10 minutes on a hot plate. The piezoelectric element thus obtained had its d33 constant measured at room temperature by a piezoelectric constant measuring device d33 meter (ALPHA CORPORATION) by using the Berlincourt method. This evaluation was repeated while sequentially increasing the heating maintaining temperature by 5° C., and the depolarization temperature Td at which the piezoelectric constant became 95% or less of the initial state was evaluated. Table 1 below shows the results of Examples and Comparative Examples.

Further, the stator 30 for a vibration wave motor of each of Examples 1 to 6 and Comparative Example 2 was impregnated in acetone in an ultrasound bath for a whole day and night, and thus the annular piezoelectric element 20 was removed from the diaphragm 9 made of SUS and the flexible printed board 8. Next, a cuboid was cut from the part of the drive phase electrode 3 in which the polarizing electrode 33 located in the vicinity of the center portion was arranged, and the cuboid was used as a piezoelectric element for evaluation of the absolute value d(1) of the piezoelectric constant. Similarly, the entire part of the non-driving region 17 in which the drive phase electrode 3 was arranged was cut to be used as a piezoelectric element for evaluation of the absolute value d(2) of the piezoelectric constant. In the piezoelectric element 20 of each of Examples 1, 3, 4, 5, and 6 and Comparative Example 2, the cut part corresponded to the position of the driving phase power supply electrode 34. In the piezoelectric element 20 of Example 2, the cut part corresponded to a part of the drive phase electrode 3 in which the polarizing electrode 33 was absent and which was adjacent to the ground electrode 5. The cut areas thereof were substantially the same for comparison.

Those piezoelectric elements for evaluation were subjected to d33 constant measurement at room temperature by a Berlincourt method, and the absolute value d(1) of the piezoelectric constant and the absolute value d(2) of the piezoelectric constant were evaluated to calculate d(2)/d(1). Table 1 below shows the results of Examples and Comparative Example.

In Examples 1 to 5, the absolute value d(2) of the piezoelectric constant was 0, and d(2)/d(1) was 0. In Example 6, the absolute value d(2) of the piezoelectric constant was not 0, but d(2)/d(1) was 0.08. On the other hand, in Comparative Example 2, the absolute value d(2) of the piezoelectric constant was the same as the absolute value d(1) of the piezoelectric constant, and d(2)/d(1) was 1. Therefore, it was understood that, in Examples 1, 3, 4, 5, and 6, the part in which the driving phase power supply electrode 34 was arranged was located within the non-driving region. Similarly, it was understood that, in Example 2, the part of the drive phase electrode 3 in which the polarizing electrode 33 was absent and which was adjacent to the ground electrode 5 was located within the non-driving region. On the other hand, it was understood that, in Comparative Example 2, the part in which the driving phase power supply electrode 34 was arranged was located within the driving region.

Further, in Examples 1 to 6, a region including the above-mentioned position (part in which the driving phase power supply electrode 34 was arranged in Examples 1, 3, 4, 5, and 6, and part of the drive phase electrode 3 in which the polarizing electrode 33 was absent and which was adjacent to the ground electrode 5 in Example 2), the ground electrode 5, and the detection phase electrode 7 was referred to as the non-driving region 17, and the average annular length of the non-driving region 17 was calculated and compared to that in the non-driving region 18. As a result, in Examples 1 to 6, the average annular length of the non-driving region 17 was 3λ/4. On the other hand, in Comparative Example 1, a region including the ground electrode 5 and the detection phase electrode 7 was referred to as the non-driving region 17, and the average annular length of the non-driving region 17 was calculated and compared to that in the non-driving region 18. As a result, in Comparative Example 1, the average annular length of the non-driving region 17 was 3λ/4. Further, in Comparative Example 2, a region including the ground electrode 5 and the detection phase electrode 7 was referred to as the non-driving region 17, and the average annular length of the non-driving region 17 was calculated and compared to that in the non-driving region 18. As a result, in Comparative Example 2, the average annular length of the non-driving region 17 was not 3λ/4, but a length smaller than 3λ/4 and larger than 2λ/4. Further, when the middle point of a boundary portion between the drive phase electrode 3 or 4 and the ground electrode 6 was set as an origin, the average annular length of the non-driving region 18 was set to λ/4. In Examples 1 to 6 and Comparative Examples 1 and 2, the average annular length of the piezoelectric element 20 was calculated. As a result, all of them were 7λ.

Based on the above-mentioned results, the relationship of the connection position of the flexible printed board and the non-driving region 17 was confirmed. Table 1 below shows the results of Examples and Comparative Examples.

TABLE 1

| | Material | Polarization temperature (° C.) | Polarization electric field (k/mm) | Polarization time period (min) | Voltage application during temperature drop | Connection position of flexible printed board | Repolarization temperature (° C.) |
|---|---|---|---|---|---|---|---|
| Example 1 | PZT | 220 | 0.6 | 30 | — | Only non-driving region | — |
| Example 2 | PZT | 220 | 0.6 | 30 | — | Only non-driving region | — |

TABLE 1-continued

| | Material | | | | | Region | |
|---|---|---|---|---|---|---|---|
| Example 3 | BCTZ-Mn | 100 | 1.0 | 180 | ○ | Only non-driving region | Room temperature |
| Example 4 | BCTZ-Mn | 100 | 1.0 | 180 | ○ | Only non-driving region | — |
| Example 5 | KNNT | 150 | 4.0 | 300 | — | Only non-driving region | — |
| Example 6 | BCTZ-Mn | 100 | 1.0 | 180 | ○ | Only non-driving region | — |
| Comparative Example 1 | PZT | 220 | 0.6 | 30 | — | Non-driving region and part of driving region | — |
| Comparative Example 2 | PZT | 220 | 0.6 | 30 | — | Non-driving region and part of driving region | — |

| | Repolarization electric field (k/mm) | Repolarization time period (min) | Maximum number of revolutions (right revolution) rpm | Maximum number of revolutions (left revolution) rpm | Tc (° C.) | Td (° C.) | d(2)/d(1) (—) |
|---|---|---|---|---|---|---|---|
| Example 1 | — | — | 110 | 108 | 310 | 250 | 0 |
| Example 2 | — | — | 108 | 111 | 310 | 250 | 0 |
| Example 3 | 0.5 | 10 | 100 | 102 | 105 | 90 | 0 |
| Example 4 | — | — | 99 | 102 | 105 | 90 | 0 |
| Example 5 | — | — | 96 | 96 | 200 | 180 | 0 |
| Example 6 | — | — | 98 | 99 | 105 | 90 | 0.08 |
| Comparative Example 1 | — | — | 78 | 75 | 310 | 250 | — |
| Comparative Example 2 | — | — | 88 | 80 | 310 | 250 | 1 |

(Note)
Material represents the following compounds.
PZT = $Pb(Zr,Ti)O_3$
BCTZ-Mn = $(Ba_{0.813}Ca_{0.187})(Ti_{0.94}Zr_{0.06})O_3 + Mn_{0.26}$ parts by weight
KNNT = $(K,Na)(Nb,Ta)O_3$ As a result of the study, the vibration wave motor 40 of each of Examples 1 to 6 had the maximum number of right and left revolutions that was markedly larger than that in Comparative Example 1. Further, the vibration wave motor 40 of each of Examples 1 to 6 had the maximum number of right and left revolutions that was larger than that in Comparative Example 2, and the difference between the maximum number of right revolutions and the maximum number of left revolutions was small.

INDUSTRIAL APPLICABILITY

According to the vibration wave drive device, the stator for a vibration wave motor, the vibration wave motor, the driving control system, and the optical apparatus of the present invention, the driving region is not inhibited by the power feeding member, and hence it is possible to provide the vibration wave drive device, the stator for a vibration wave motor, the vibration wave motor, the driving control system, the optical apparatus that have higher performance, smaller size, lower cost, and higher quality.

According to the present invention, at least one electrode provided on the first surface is arranged across the driving region and the non-driving region, and is electrically connected to the power feeding member only in the non-driving region. Therefore, the power feeding member can be electrically connected only in the non-driving region, and thus the driving region is not inhibited by the power feeding member. Therefore, it is possible to provide the vibration wave drive device, the stator for a vibration wave motor, the vibration wave motor, the driving control system, the optical apparatus, and the manufacturing method of a vibration wave driving device, which are capable of achieving higher performance, higher quality, and lower cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-135972, filed Jun. 28, 2013, which is hereby incorporated by reference herein in its entirety.

REFERENCE SIGNS LIST

1 piezoelectric material
2 common electrode
3 drive phase electrode
4 drive phase electrode
5, 6 ground electrode
7 detection phase electrode
8 power feeding member (flexible printed board)
8a electric wire
8b insulator (base film)
9, 725b diaphragm
10 short-circuiting wire
11, 725c rotor
15 driving region
16 driving region
17 non-driving region
18 non-driving region
19a, 19b connection electrode
20 piezoelectric element
25 vibration wave drive device 30 stator for vibration wave motor
33 polarizing electrode
34 driving phase power supply electrode
40, 725 vibration wave motor
701 front lens
702 rear lens (focus lens)
711 mount
712 fixed barrel
713 linear guide barrel
714 front lens group barrel
715 cam ring
716 rear lens group barrel
717a, 717b cam roller
718 shaft screw
719 roller
720 rotation transmitting ring
722 roller
724 manual focus ring
726 wave washer
727 ball race
728 focus key
729 joint member
732 washer
733 low-friction sheet

The invention claimed is:

1. A vibration wave drive device, comprising:
an annular piezoelectric element comprising a one-piece piezoelectric material and multiple electrodes; and
a power feeding member comprising an electric wire for supplying electric power to the piezoelectric element, the power feeding member being provided on a first surface of the piezoelectric element,
wherein the piezoelectric element comprises two driving regions, and a non-driving region arranged between the two driving regions, and
wherein the power feeding member is arranged only in the non-driving region and a voltage is applied to the drive regions through an electrode provided in the non-driving region.

2. The vibration wave drive device according to claim 1, wherein the piezoelectric element is configured to vibrate by a traveling wave of a wavelength $\lambda$, the non-driving region of the piezoelectric element has an average annular length of $n\lambda/4$, and n is one of 1 and 3.

3. The vibration wave drive device according to claim 1, wherein the following relationship is satisfied:

$0 \leq d(2) < 0.1 d(1)$, where d(1) represents an absolute value of a piezoelectric constant of each of the two driving regions and d(2) represents an absolute value of a piezoelectric constant of a part of the non-driving region, which includes the electrode.

4. The vibration wave drive device according to claim 1, wherein the non-driving region comprises a detection region for detecting vibration of the vibration wave drive device, and
wherein the annular piezoelectric element further comprises a detection phase electrode arranged on the first surface of the detection region, the detection phase electrode being electrically connected to the power feeding member.

5. The vibration wave drive device according to claim 1, wherein, when a surface opposed to the first surface is a second surface, the annular piezoelectric element comprises a ground electrode arranged on the first surface of the non-driving region, the ground electrode being electrically connected to an electrode on the second surface and being electrically connected to the power feeding member.

6. The vibration wave drive device according to claim 1, wherein the power feeding member comprises a flexible printed board.

7. A stator for a vibration wave motor, comprising at least:
the vibration wave drive device according to claim 1; and
a diaphragm provided on at least one electrode surface of the annular piezoelectric element.

8. A vibration wave motor, comprising at least:
the stator for a vibration wave motor according to claim 7; and
a rotor provided in contact with a vibrating surface of the diaphragm.

9. A driving control system, comprising at least a drive circuit that is electrically connected to the vibration wave motor according to claim 8 through intermediation of the power feeding member.

10. An optical apparatus, comprising the driving control system according to claim 9.

11. A method of manufacturing the vibration wave drive device according to claim 1, the method comprising:
providing a polarizing electrode on the first surface in each of the two driving regions, providing a driving phase power supply electrode on the first surface in the non-driving region, and providing a common electrode on a second surface;
applying a voltage to the polarizing electrode to subject the one-piece piezoelectric material to polarization processing;
providing a connection electrode across the polarizing electrode and the driving phase power supply electrode; and
electrically connecting the driving phase power supply electrode and the power feeding member to each other only in the non-driving region.

* * * * *